(12) United States Patent
Nikkhoo et al.

(10) Patent No.: US 12,317,408 B2
(45) Date of Patent: May 27, 2025

(54) STACK-PCB ARCHITECTURE WITH EMBEDDED VAPOR CHAMBER

(71) Applicant: Meta Platforms Technologies, LLC, Menlo Park, CA (US)

(72) Inventors: Michael Nikkhoo, Saratoga, CA (US); Brian Toleno, Cupertino, CA (US); Patrick Codd, Carnation, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 266 days.

(21) Appl. No.: 17/848,092

(22) Filed: Jun. 23, 2022

(65) Prior Publication Data

US 2024/0098877 A1    Mar. 21, 2024

(51) Int. Cl.
*H05K 1/02* (2006.01)
*H05K 7/20* (2006.01)

(52) U.S. Cl.
CPC ....... *H05K 1/0207* (2013.01); *H05K 7/20309* (2013.01); *H05K 7/20336* (2013.01)

(58) Field of Classification Search
CPC ................. H05K 1/112; H05K 1/0298; H05K 2201/0195; H05K 2201/096
USPC ........................................................ 174/262
See application file for complete search history.

(56) References Cited

U.S. PATENT DOCUMENTS

| | | | |
|---|---|---|---|
| 5,181,167 A * | 1/1993 | Davidson | H05K 7/023 174/16.3 |
| 6,084,771 A * | 7/2000 | Ranchy | H05K 7/20927 361/716 |
| 6,335,491 B1 * | 1/2002 | Alagaratnam | H01L 23/49833 174/262 |
| 7,068,515 B2 | 6/2006 | Harris et al. | |
| 7,286,365 B2 * | 10/2007 | Sarno | H01L 25/18 361/689 |
| 8,274,792 B2 | 9/2012 | Soffer | |
| 9,547,344 B2 | 1/2017 | Han | |
| 9,578,780 B1 | 2/2017 | Shih et al. | |
| 9,639,127 B2 | 5/2017 | Kim | |
| 2020/0344924 A1 * | 10/2020 | Harrigan | H05K 3/368 |
| 2021/0112656 A1 | 4/2021 | McCulley et al. | |
| 2021/0384104 A1 | 12/2021 | Doria et al. | |
| 2023/0156900 A1 * | 5/2023 | Cavallaro | G06F 1/203 361/679.54 |

FOREIGN PATENT DOCUMENTS

JP        2021188798 A        12/2021

OTHER PUBLICATIONS

Non-Final Office Action mailed Feb. 16, 2023 for U.S. Appl. No. 17/482,229, filed Sep. 22, 2022, 10 pages.

* cited by examiner

*Primary Examiner* — Timothy J Thompson
*Assistant Examiner* — Michael F McAllister
(74) *Attorney, Agent, or Firm* — McDermott Will & Emery LLP

(57) ABSTRACT

An interposer equipped with a heat spreader and a multi-board system for an electronic device that includes an interposer equipped with a heat spreader between at least two boards. In examples, the interposer may include a heat spreader having an active portion and, optionally, a passive portion. In examples, the active portion may include a vapor chamber, heat pipe, or isothermal plate. In examples, the passive portion may thermally couple the active portion to a heat dissipation device such as a heat sink and/or an outer frame of the electronic device.

15 Claims, 17 Drawing Sheets

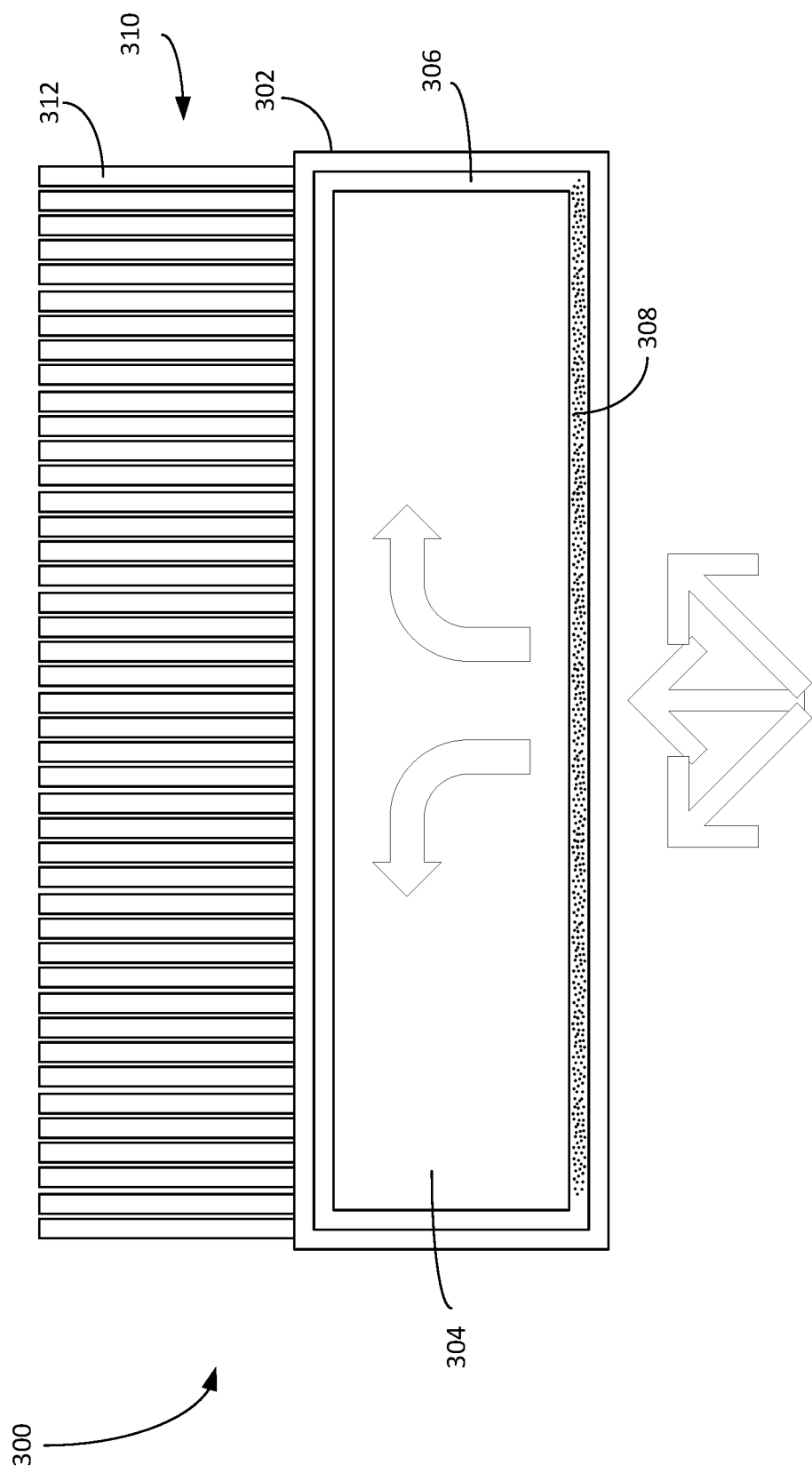

STACK-PCB ARCHITECTURE WITH EMBEDDED VAPOR CHAMBER

BACKGROUND

Product design generally includes one or more boards and/or flexible circuits to enable design. Printed Circuit Boards (PCB) are often employed to mechanically support and electrically connects complementary elements. One or more conductive tracks, pads and other features may be used to make the electrical connections. A PCB may include one or more sheets or layers of metal, such as copper, laminated onto and/or between sheet layers of a non-conductive substrate. There are different types of PCB used in the industry. For examples, a PCB can be a single layer PCB that has a single layer of conductive material only one side of the substrate, a double layer PCB that includes a layer of conductive material on both sides of a substrate, a multi-layer PCB with conductive material on both sides of the substrate, and conductive material sandwiched within the substrate, a high density interconnect (HDI) PCB that includes multiple conductive layers, laser drilled micro vias, fine lines and tolerances, and advanced laminate materials, and a high frequency PCB designed to facilitate signals over 1 gigahertz. Flexible circuits, also known as flex circuit boards, are also a type of PCB. Flex circuits typically include a printed circuit board where the board has at least a bendable portion. Flex circuits are often used as flexible flat cable in place of cable wires and connectors. To provide structural stability to a computing device, metal frames are often employed. The metal frames, however, tend to be bulky and require sacrificing space in exchange for structural integrity and stability.

Existing designs employing PCBs mounted to metal frames and coupled together with flex circuits tend to result in complicated, messy packaging, tend to be heavy and bulky, and may be incapable of distributing and dissipating heat generated by portable devices with ever increasing performance requirements.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different figures indicates similar or identical components or features. Furthermore, the drawings may be considered as providing an approximate depiction of the relative sizes of the individual components within individual figures. However, the drawings are not to scale, and the relative sizes of the individual components, both within individual figures and between the different figures, may vary from what is depicted. In particular, some of the figures may depict components as a certain size or shape, while other figures may depict the same components on a larger scale or differently shaped for the sake of clarity.

FIG. 3 illustrates a diagram of an example vapor chamber that can be used in connection with a stack-PCB architecture such as that shown in FIG. 1.

DETAILED DESCRIPTION

Figure 1A:
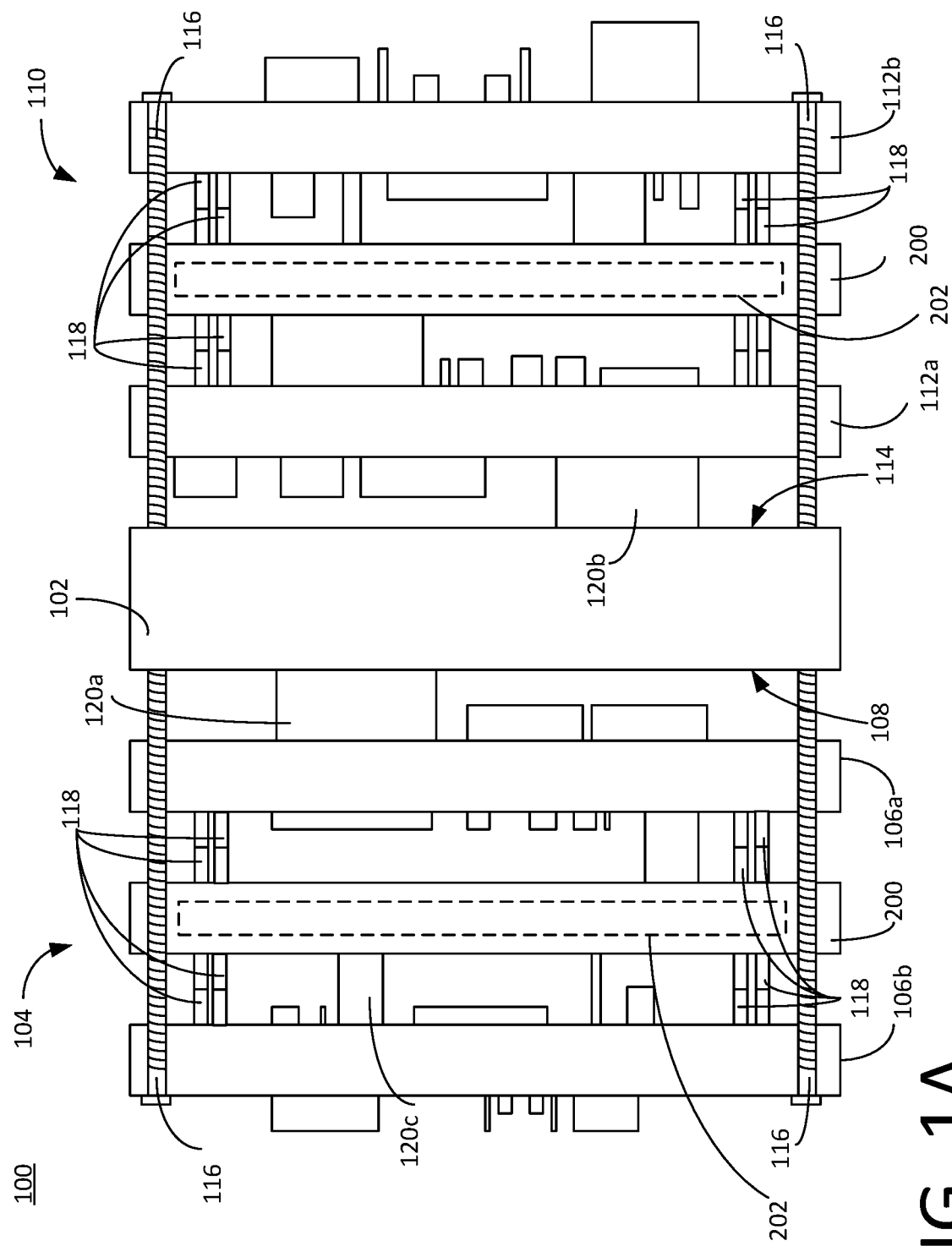
FIG. 1A illustrates a diagram of examples of a stack-PCB architecture as described herein.

Disclosed herein is an embedded heat spreader in a stack printed circuit board (stack-PCB) architecture for a product design. In examples, the embedded heat spreader is provided at an interposer. In examples, a heat spreader may include at least an active portion. In examples, a heat spreader may include an active portion and a passive portion. In examples, an active portion may include a portion of the heat spreader to which heat is transferred from one or more electronic components. In examples, a passive portion may include a portion of the heat spreader that extends from the active portion. In examples, the passive portion may be thermally coupled to one or more heat sinks.

In examples, a heat spreader may be floating within a space defined by an interposer. In examples, a heat spreader may include one or more pigtails extending outside the boundaries of an interposer. In examples, a heat spreader may include a peripheral area that extends beyond a boundary of an interposer.

In examples, an active portion of the heat spreader may include a vapor chamber, a heat pipe, and/or one or more layers of heat transfer materials. In examples, an active portion of a heat spreader may distribute heat in a longitudinal direction (i.e., perpendicular to the layers of the stack-PCB). In examples, an active portion of a heat spreader may include an isothermal plate. In examples, an active portion of a heat spreader may include a vapor chamber. In examples, an active portion of a heat spreader may include a heat pipe. In examples, the vapor chamber or heat pipe may include a titanium vapor chamber or heat pipe. Additionally, or alternatively, an active portion of a heat spreader may include a core or one or more layers of graphite extending at least partially along a length of the heat spreader to enhance a heat transfer ability of the heat spreader in the longitudinal direction. In examples, a heat spreader may include additional or alternative heat transfer components or structures as described herein.

In examples, a passive portion of a heat spreader may include one or more layers of thermally conductive material. In examples, a passive portion may be formed of the same or similar material as the active portion. In examples, a passive portion of a heat spreader may be formed by extending an outer wall of the active portion of the heat spreader. In examples, a passive portion of a heat spreader may be formed by extending a bottom portion of the active portion over which a fluid flows as described later. In examples, a passive portion of a heat spreader may be thinner than the active area of the heat spreader.

In examples, the active portion of a heat spreader provided at an interposer may be located within an internal area defined by the interposer. In examples, at least a portion of a passive portion of a heat spreader provided at an interposer may extend beyond an outer perimeter of the interposer.

In examples, a stack-PCB may include a midplane architecture. In examples, a core frame may be employed to provide support. In examples, the core frame may be a frame, a heat spreader as similarly described herein for incorporation in an interposer, or a combination of both. In examples, one or more the stack-PCB may include one or more electronic devices on one or both sides of the core frame.

In examples, the one or more electronic devices may include one or more PCBs, complementary elements, or a combination of both.

In examples, heat generated by one or more components of the electronic devices may be distributed and/or exhausted via one or more heat spreaders provided in one or more interposers as described herein. In examples, an additional heat may be spread and/or transferred uniformly through the device by an additional heat spreader provided as the support structure. In examples, by distributing heat throughout the device it may be possible to avoid temperature differentials (or hot spots). In examples, by transferring heat to one or more heat sinks, it may be possible to dissipate more heat from an exterior of the device. In examples, one or more of these heat management systems may allow for higher performance processors, displays, and other heat generating components to be used, for longer periods of time, and/or at lower temperatures.

In examples, one or more complementary elements may include one or more PCBs. In examples, one or more complementary elements may include non-PCB components. In examples, the one or more complementary elements on the second side of the core frame may include sensor boards (including, for example, cameras, image sensors, microphones, temperature sensors, time of flight sensors, etc.), optics boards (including, for example, display screens, projectors, display drivers, etc.), inertia boards (including, for example, inertial sensors such as accelerometers or gyros, magnetometers, etc.), and/or radio frequency boards (e.g., including, for example, one or more radio frequency modules, radios, antennas, etc.).

In examples, the one or more PCBs and/or one or more complementary elements may be arranged on a first side and second side of a core frame provided in a PCB-stack architecture. Any of the boards described as being on the first side may be located on the second side and vice versa. In some examples, components of multiple different types of boards may be combined with one another (e.g., any one or more of the boards may include RF components, sensors, inertial measurement components, optics components, and/or system components). The stack-PCB architecture may include multiple layers (e.g., two, three, four, or more layers) of boards. The number of layers provided on the first side of the core frame may be the same as or different than the number of layers on the second side of the core frame. In examples, a stack-PCB architecture as described may include a tri-layer structure on the first side of the core frame and the one or more complementary elements on the second side of the core frame may provide the same (e.g., three) or different number (e.g., one, two, four, etc.) of layers on the second side of the core frame as there are on the first side of the core frame.

In examples, one or more interposers equipped with a heat spreader as described herein may be provided between two stacked printed circuit boards, between a printed circuit board and a complementary element, and/or between two complementary elements. In examples, an interposer as described herein may provide a communication link between the respective layers of the stack-PCB system. The use of an interposer may reduce or eliminate connector count. In examples, an interposer may allow for an increased I/O count; thus, enabling more processing power in smaller space/volume because of the higher volumetric efficiency. The interposer(s) may also further spread and/or dissipate heat by including one or more heat spreaders.

In examples, the stack-PCB architecture as described may provide a higher volumetric efficiency. In examples, the stack-PCB architecture may provide more processing power in a compact space and/or volume, allowing devices employing the stack-PCB arrangement according to this application to run more computationally intensive programs, for longer periods of time, and/or to operate at lower temperatures. In examples, the stack-PCB may provide a higher input/output count when compared to standard arrangements, allowing devices employing the stack-PCB arrangement according to this application to connect to more sensors or other components and/or to enable higher and/or higher bandwidth communications.

In examples, employment of an interposer equipped with a heat spreader as described may result in improved thermal architecture and/or decreased junction temperatures.

In examples a stack-PCB architecture including one or more interposers equipped with heat spreaders such as a vapor chamber or other heat spreader may exhibit improved rigidity. In examples, the combination of the stack-PCB architecture as described herein with one or more boards connected by one or more interposers may form a truss-like structure in which the various components are organized so that the whole assemblage can behave as a single object able to exhibit sufficient structural integrity and rigidity to provide a stable configuration. In examples, greater rigidity may lead to elevated mechanical frequencies and thus reduce or mitigate solder fatigue and/or fracture. In examples, the improved structural integrity provided by the combination of a stack-PCB architecture may lead to a more compact and/or light weight design particularly suitable for smaller computing devices such as wearable devices.

In examples, the stack-PCB architecture as described may simplify testing. In examples, the multi-board system can result in a more compact assembly with a smaller bill of material (BOM). This in turn may decrease challenges with design for manufacture and design for excellence. In examples, the stack-PCB architecture as described may include a design that may be readily scalable.

Product design traditionally uses discrete multi-layer boards and flexible circuits to enable design. The connection between the boards can typically be made via connector and specific terminations as design and logistics dictate. This arrangement, however, often may lead to messy packaging as well as testing and debug challenges. These types of manufacturing inefficiencies can raise numerous issues. Moreover, the traditional packaging approach may have an adverse impact on thermal design, spatial optimization, and form factor. For example, the traditional packaging can impede air flow, it may lead to higher pressure drop, and/or may increase decibel noise level.

Accordingly, a more layered design may be advantageous to address the shortcomings of traditional packaging approach.

In examples, the disclosed stack-PCB architecture may be employed in any computing device. In examples, the disclosed stack-PCB architecture may be employed in portable computing devices such as wearable devices, extended reality computing devices such as headsets or glasses, mobile phones, handheld computers, gaming devices, cameras, laptops, or other portable computing devices. For purposes of this description a portable computing device refers to a computing device that a person of average size and strength can carry with one hand. In examples, the disclosed stack-PCB architecture may be employed in non-portable computing devices such as desktop computers, appliances, integrated computing components and the like.

In examples, an interposer may include a laminate structure defining an inner space and a heat spreader having an active portion located in the inner space, wherein the active portion of the heat spreader has a thickness that may be less than a depth of the inner space.

In examples, the laminate structure may include one or more connection points, each connection points may include a through chip via. In examples, the interposer may include a metal plating over at least each connection point.

In examples, the active portion may include a vapor chamber, a heat pipe, or an isothermal plate.

In examples, the heat spreader may include a passive portion. In examples, the passive portion may extend from the active portion to outside an outer boundary of the laminate structure. The passive portion is thermally coupled to the active portion. In examples, the passive portion may be an extension of the active portion.

In examples, a tri-layer structure may include a first printed circuit board, a second printed circuit board, an interposer positioned between the first printed circuit board and the second printed circuit board and coupled to the first printed circuit board and to the second printed circuit board, and a heat spreader located in the interposer.

In examples, the heat spreader may include an active portion nested within an inner space defined by the interposer.

In examples, at least one of the first printed circuit board and second circuit board may include one or more electronic components thermally coupled to the heat spreader.

In examples, the heat spreader may include a passive portion extending from the active portion to beyond an outer boundary of the interposer.

In examples, the active portion may include a vapor chamber, a heat pipe, or an isothermal plate.

In examples, the interposer may include FR4 material.

In examples, a stack-PCB architecture may include a core frame, two or more printed circuit boards on a first side of the core frame, the two or more printed circuit boards interconnected by one or more first interposers, and two or more complementary elements on second side of the core frame, the second side of the core frame being opposite the first side of the core frame, the two or more complementary elements interconnected by one or more second interposers, wherein at least one of the first interposers or second interposers may include a heat spreader.

In examples, the core frame may include a second heat spreader.

In examples, the heat spreader may include an active portion nested within an inner space of the at least one of the first interposers or second interposers. In examples, the active portion may include a vapor chamber, a heat pipe, or an isothermal plate.

In examples, the heat spreader may include a passive portion extending from the active portion to beyond an outer boundary of the interposer. In examples, the passive portion may be thermally coupled to the active portion and to a heat dissipating structure.

In examples, an interposer equipped with heat spreader as described herein may be employed between any two board structures including printed circuit boards, complementary elements as described herein, or any combination thereof. In examples, an interposer and heat spreader can form a three layer or tri-layer structure when sandwiched between two board structures. In examples, a first board and second board can be provided on both sides of an interposer and interconnected to each by through contact vias formed in the interposer. In examples, a heat spreader may be integrated in the interposer to promote isothermal conditions, spread of thermal energy, and/or thermal energy dissipation. In examples, a tri-layer structure may be implemented in any electronic architecture that includes two or more boards with one or more electronic components.

FIG. 1A illustrates a cross-section view of examples of a stack-PCB architecture 100 in which one or more tri-layer structures including an interposer 200 equipped with a heat spreader 202 as described herein may be employed. The stack-PCB architecture 100 is simply an example implementation for illustrative purposes. An interposer 200 equipped with a heat spreader 202 as described herein may be employed in any PCB architecture that includes two or more interconnected PCBs and/or complementary elements as described.

In examples, the stack-PCB architecture 100 may include a core frame 102 with a system stack 104 of one or more printed circuit boards (PCBs) 106 mounted onto at least a first side 108 of the core frame 102 and a complementary stack 110 of one or more complementary elements 112 mounted onto at least a second side 114 of the core frame 102, wherein one or more interposers 200 equipped with a heat spreader 202 may be employed to connect two consecutive PCBs 106, complementary elements 112, or PCB and complementary element. While PCBs 106 and complementary elements 112 are shown and described on opposite sides of core frame 102, this arrangement is only an example. In examples, one or more PCBs 106 and one or more structures used as complementary elements 112 may be located on the same side of core frame 102. In examples, an interposer may offer a wide conduit or bridge for signal transfer while minimizing the distance between printed circuit boards. In examples, this may result in a reduced or minimized resistance and/or capacitance delay. In examples, an interposer 200 equipped with a heat spreader 202 may help distribution and/or dissipate heat of stack-PCB architecture 100.

In examples, stack-PCB architecture 100 may include a system stack 104 including one or more printed circuit boards 106 on a first side 108 of the core frame 102. In examples, a printed circuit board 106 may have any desired design. In examples, a printed circuit board 106 be a single layer, double layer, or multi-layer printed circuit board, a high-density interconnect (HDI) PCB, and/or a high frequency PCB. In examples, at least one printed circuit board 106 in system stack 104 may include a system on chip printed circuit board. A system on chip printed circuit board may also be referred to as motherboard, mainboard, or logic board. In examples, a system on chip printed circuit board may include a primary central processing unit (CPU) for the computing device of which the stack-PCB architecture is part. In examples, the system on chip printed circuit board may serve to connect the CPU to one or more other parts of a computing device. In examples, a system on chip printed circuit board may connect CPU to memory, one or more hard drives, one or more additional ports and expansion cards, or any combination thereof.

In examples, a printed circuit board 106 may include passive components, active components, or a combination thereof. In examples, one or more printed circuit boards 106 may include electronic components on at least on side. In examples, one or more printed circuit boards 106 may include a multi-layer board (MLB), which may include electronic components on both sides. In examples, one or more printed circuit boards 106 may include one or more functional printed circuit boards. In examples, a functional printed circuit board may also be referred to as daughter card. In examples, a functional printed circuit board may include an interface printed circuit board. An interface printed circuit board may be one that allows interaction with a user and/or with another device. In examples, an interface printed circuit board may allow a computing device to communicate with one or more peripheral devices. In examples, a function printed circuit board may include an RF printed circuit board. In examples, other types of printed circuit boards may be included in place of and/or in addition to an RF board. In examples, an RF board may also be an MLB. In examples, printed circuit boards 106 may include other types of boards such as a logic board, display board, communication board, sensors boards, optic boards, inertia board, or any other board that may be desired for the particular application.

Figure 1B:
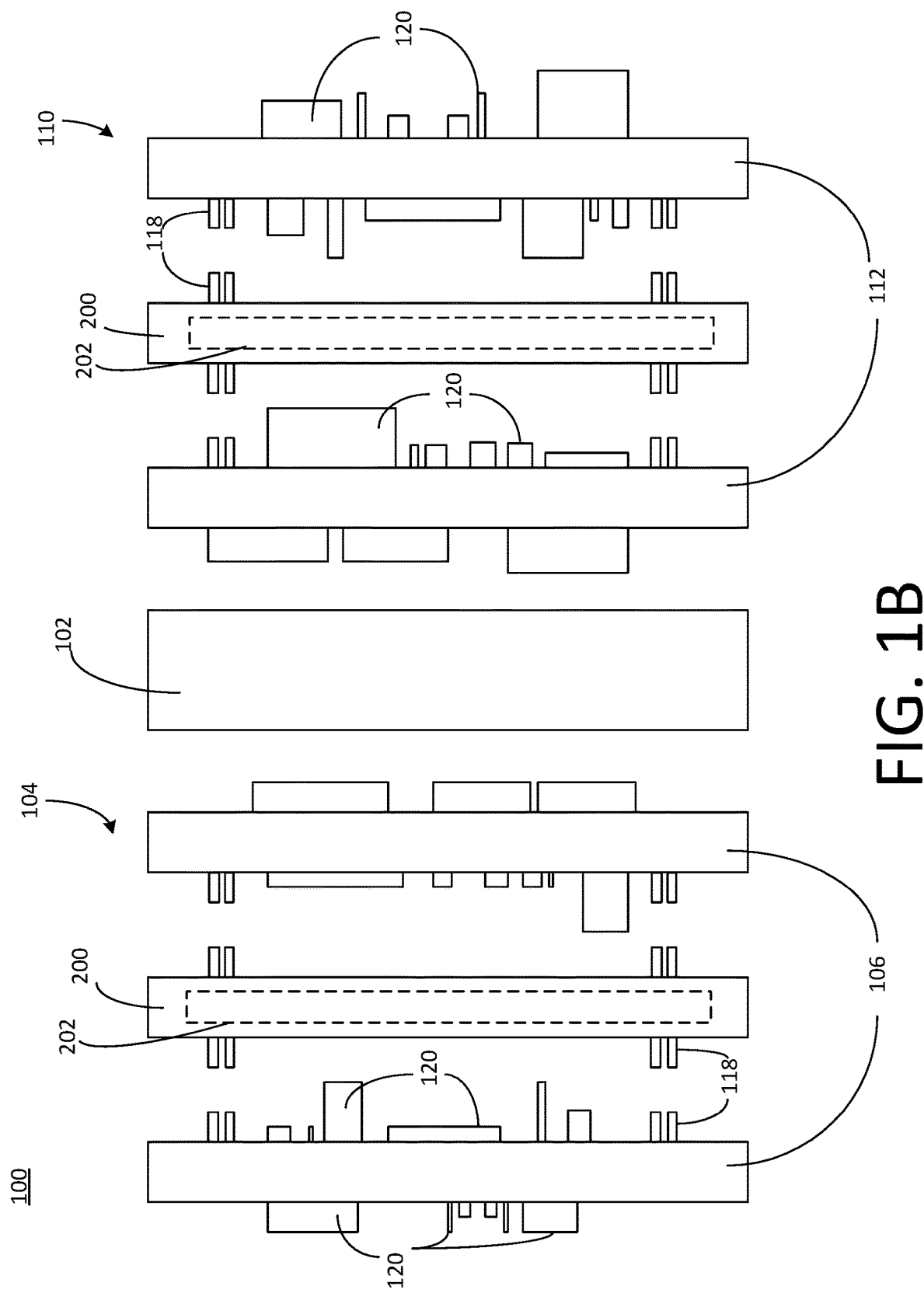
FIG. 1B illustrates an exploded diagram of examples of a stack-PCB architecture as described herein.

As illustrated the one or more printed circuit boards 106 are shown as coextensive. However, this is only an example. Each one of the one or more printed circuit boards 106 may have any shape or size independent of any other component of the stack-PCB architecture 100. In examples, at least one of the one or more printed circuit boards 106 may have a larger area size than at least one other of the one or more printed circuit boards 106. In examples, a printed circuit board 106 may have a multilateral shape, a circular shape, an oval shape, and may have a regular or irregular shape. In examples, the number of printed circuit boards 106 that may be stacked on the first side 108 of the core frame 102 is not limited. As illustrated in FIGS. 1A and 1B, in examples where two or more printed circuit boards 106 are provided, the printed circuit boards 106 may be arranged parallel to each other, to core frame 102, complementary stack 110, one or more complementary elements 112, or any combination thereof with one or more interposers 200 included therein.

In examples, stack-PCB architecture 100 may include a complementary stack 110 including one or more complementary elements 112 on a second side 114 of the core frame 102. In examples, the one or more complementary elements 112 may include one or more board or board-like structures. Board-like structure refers to a structure that has a given thickness between two flat surfaces. The peripheral shape of a board or board-like structure is not particularly limited and can be any multilateral shape, circular shape, oval shape, and any regular or irregular shape. In examples, the one or more complementary elements 112 may include the same size and shape as one or more printed circuit boards 106 of system stack 104.

In examples the one or more complementary elements 112 may be arranged to be parallel to core frame 102, system stack 104, and/or one or more printed circuit boards 106. In examples, where two or more complementary elements 112 are present, they may be arranged parallel to each other. In examples, the one or more complementary elements 112 may be mounted to core frame 102.

In examples, one or more complementary elements 112 may include electrically conductive material, electrically insulating material, or a combination thereof. In examples, one or more complementary elements 112 may include passive components, active components, or a combination thereof. In examples, one or more complementary elements 112 may exhibit no functionality.

In examples, the one or more complementary elements 112 may include one or more printed circuit boards. In examples, one or more complementary elements 112 may include a processor. In examples, one or more complementary elements 112 may include combination of a processor and one or more system components such as sensors. In examples, one or more complementary elements 112 may include one or more inertia boards, sensors boards, optic boards, or any combination thereof. In examples, sensors boards may include tracking sensors such as, for example, eye tracking or face tracking, or other sensors such as external sensors, internal sensors, and the like. In examples, one or more electrical connections may be provided between any two complementary elements 112. Electrical connections may be made using an interposer 200 as previously described.

In examples, two or more complementary elements 112 of complementary stack 110 may be interconnected together. In examples, an interposer 200 with a heat spreader 202 may be used to connect one complementary element 112a to another complementary element 112b.

In examples, system stack 104 may include one or more PCBs 106 and/or interposers 200 each forming a layer of system stack 104. Similarly, the complementary stack 110 may include one or more complementary elements 112 and/or interposers 200 each forming a layer of complementary stack 110. In examples, the number of layers of system stack 104 may be the same as the number of layers of complementary stack 110. In examples, the number of layers of system stack 104 may be different from the number of layers of complementary stack 110. In examples, system stack 104 includes at least one PCB 106 and an interposer 200 equipped with a heat spreader 202. In examples, a complementary stack 110 includes at least one complementary element 112 and an interposer 200 equipped with a heat spreader 202.

As illustrated in FIGS. 1A and 1B, one or more printed circuit boards 106 of system stack 104 and/or one or more complementary elements 112 of complementary stack 110 may include one or more electronic components 120. In examples, one or more electronic components 120 may be present on one or more sides of a printed circuit board 106 and/or complementary element 112. As illustrated in FIGS. 1A and 1B, in examples one or more electronic components 120 may be present on opposite sides of one or more printed circuit boards 106 and/or one or more complementary elements 112. The type and arrangement of one or more electronic components 120 on any one printed circuit board 106 and/or complementary element 112 can be selected based on the desired functionality. In examples, one or more electronic components 120 may include active devices, passive devices, or a combination of both. Passive devices may include resistors, capacitors, inductors, diodes, crystals, relays, and other like structures. Active devices may include transistors, integrated circuits (IC), and other like structures. In examples, one or more printed circuit boards 106 and/or one or more complementary elements 112 may include a ball grid array design to enable the mounting of one or more electronic components 120.

In examples, to ensure that thermal energy is generally distributed across the stack-PCB architecture and ideally isothermal conditions are achieved, the one or more printed circuit boards 106 of system stack 104 and the one or more complementary elements 112 of complementary stack 110 may be configured with one or more electronic components 120 in a manner that distributes the overall load. In examples, heavy load electronic components 120 and/or heavy load arrangements of components 120 may be provided in separate printed circuit boards 106 and/or complementary elements 112. In examples, printed circuit boards 106 and/or complementary elements 112 that carry heavier loads compared to other printed circuit boards 106 and/or complementary elements 112 may be arranged closest to a heat spreader 202 and/or at least an active portion 218 of a heat spreader 202 as described herein.

The different components of the stack-PCB architecture 100 may be fastened together using one or more fasteners 116. Any number of fasteners 116 may be used as desired or as may be necessary. In examples, fasteners 116 may include bolts, screws, pins, or like structures. In examples, fasteners 116 include bolts. In examples, fasteners 116 can be configured to engage core frame 102, one or more printed circuit boards 106, one or more complementary elements 112, or any combination thereof. In examples, fasteners 116 may be configured to additionally engage one or more additional structures provided in the stack-PCB architecture 100. In examples, fasteners 116 may be configured to engage one or more interposers 200. FIG. 1 illustrates separate fasteners 116 for the one or more printed circuit boards 106 and for the one or more complementary elements 112. This is only an example. In examples, one or more contiguous fastener 116 may be used to secure one or more printed circuit boards 106 and one or more complementary elements 112 of stack-PCB architecture 100. In examples, provisions may be provided around the perimeter of the core frame 102. For example, the core frame 102 may include one or more threaded studs extending out of plane or through-hole provisions. In examples, a fastener 116 does not traverse the active portion of the core frame 102.

Figure 2A:
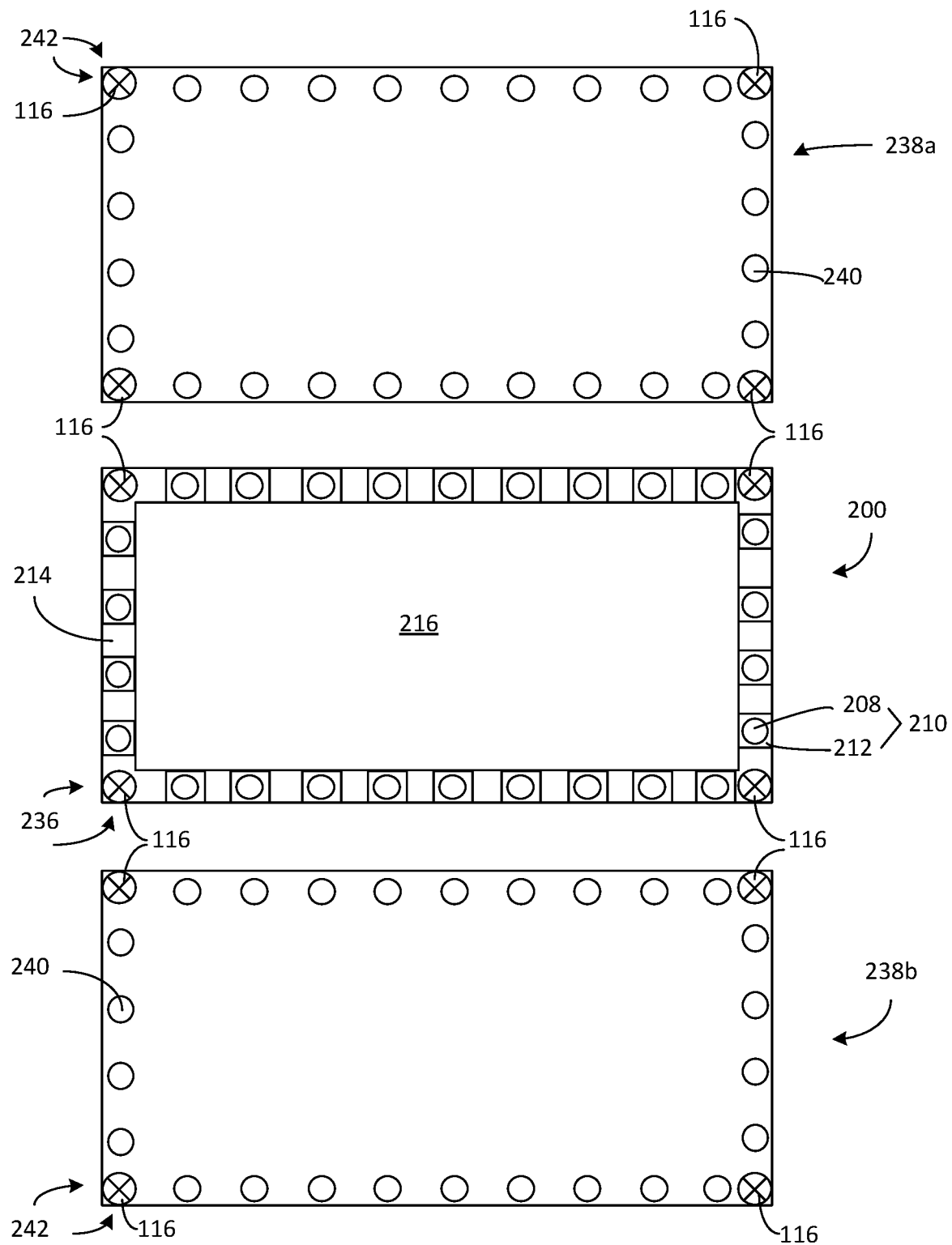
FIG. 2A-2O illustrates a diagram of examples of interposers equipped with a heat spreader that may be used as interconnection between printed circuit boards and/or complementary elements.

In examples, fasteners 116 may be provided at one or more corners of stack-PCB architecture 100 and/or at one or more central location of stack-PCB architecture 100. For example, as illustrated in FIGS. 1A and 2A, in examples, one fastener 116 may be provided at each corner and one may be provided at an internal area of stack-PCB architecture 100. Fasteners 116 may be arranged in the symmetrically or asymmetrically about core frame 102. In examples, fasteners 116 may be arranged in a similar manner for complementary stack 110 as for system stack 104. In examples, fasteners 116 may be configured to penetrate through at least a portion of one or more PCBs 106, complementary elements 112, and/or interposers 200.

FIG. 1B illustrates an exploded view of stack-PCB architecture 100 with the fasteners 116 removed. FIGS. 1A and 1B illustrate two printed circuit boards 106a and 106b in system stack 104, with a single interposer 200 connecting printed circuit boards 106a and 106b. In examples, system stack 104 may include only a single printed circuit board 106. In examples, system stack 104 may include three or more printed circuit boards 106. In examples where system stack 104 include three or more printed circuit boards 106, one or more interposers 200 may be provided between any two printed circuit boards 106. In examples, system stack 104 includes three or more printed circuit boards, the system stack 104 may include alternating printed circuit boards 106 and interposers 200. Likewise, although FIGS. 1 and 2 illustrate two complementary elements 112 with a single interposer 200 connecting them, this is merely an example as the architecture may include three or more complementary elements 112 with one or more interposers 200 provided between any two complementary elements 112. In examples, complementary stack 110 may include three or more complementary elements 112, the complementary stack 110 may include alternating complementary elements 112 and interposers 200. In examples, every interposer 200 may include a heat spreader 202 as described. In examples, one interposer 200 may include a heat spreader 202 as described. In examples, at least one interposer 200 may include a heat spreader 202 as described.

FIGS. 2A-2O illustrate examples of interposers 200. In some examples, interposer 200 may be equipped with a heat spreader 202. FIGS. 2A, 2D, 2H, and 2L illustrate top-down view of two board assemblies 238a and 238b, and of an interposer 200 equipped with a heat spreader 202. In examples, an interposer 200 equipped with a heat spreader 202 as described herein may be employed is a tri-layer structure between two board structures. In examples, board assemblies 238a and 238b can be any board electronic structure. For examples, board assemblies 238a and 238b can each independently be a PCB 106 or a complementary element 112 as described herein. In examples, board assemblies 238a and 238b may include two PCBs of any type, two complementary elements 112 of any type, or a combination of a PCB and a complementary element. In examples, as shown in FIGS. 1A and 1B, the interposer 200 may be positioned in parallel between the two shown PCBs 106a and 106b. In examples, PCBs 106a and 106b may include any type of PCBs. Also, the same arrangement of interposer 200 may be provided between two complementary elements 112 as shown in FIGS. 1A and 1B. All description provided with reference to FIGS. 2A to 2O is equally applicable to an arrangement where interposer 200 equipped with a heat spreader 202 is provided between two PCBs, two complementary elements, and/or between a complementary element and a PCB. In examples, board assembly 238a may include an MLB PCB and board assembly 238b may include an RF board.

In examples, an interposer 200 may include a laminate structure 230. In examples, interposer 200 may include two laminated mounts or rims 204 and 206. In examples, each mount or rim 204 and 206 may independently include silicon and/or organic materials. In examples, interposer 200, mounts or rims 204 and/or 206 may include a composite material. In examples, interposer 200, mounts or rims 204 and/or 206 may include an epoxy. In examples, interposer 200, mounts or rims 204 and/or 206 may include FR4 material. In examples, mounts 204 and 206 may include the same or different materials. In examples, mounts 204 and 206 may have the same or different thickness. In examples, an interposer 200 may have a combined thickness of mounts 204 and 206 of about 1 mm to 1.5 mm.

As illustrated, an interposer 200 may include links that may be attached to a substrate by through silicon vias (TSVs) or through-chip vias 208. In examples, the links and/or the one or more through silicon vias (TSVs) or through-chip vias 208 may be provided in the laminate structure 230 of the interposer 200. In examples, TSVs or through-chip vias 208 may be formed by any suitable process such as chemical etching, laser, or other means. For purposes of this disclosure a TSV or through-chip via refers to a vertical electrical connection that passes completely through a wafer, substrate, or die. In examples, vias 208 may be configured to pass through the laminated mounts 204 and 206. In examples, an interposer can be metallized from the top, bottom, and side to connect it to the surrounding components of the system.

In examples, an interposer 200 and/or a mount 204 or 206 may include a heat transfer material. In examples, an interposer 200 may be configured to transfer, distribute, and/or diffuse heat. The heat conductivity of an interposer 200 may be isotropic or anisotropic. In examples, an interposer 200 can include an isothermal body.

In examples, connections between a board assembly 238, such as a PCB 106 or a complementary element 112, and an interposer 200 may be made via any suitable fashion. In examples, one or more connections between a board assembly 238 and an interposer 200 may include one or more solder bumps as for example illustrated by solder bumps 118 in FIGS. 1A and 1B.

FIG. 2A illustrates a top-down view of example board assemblies 238a and 238b and interposer 200. The connection points 210 on interposer 200 may be arranged as desired. In examples, connection points 210 may be through silicon vias (TSVs) 208. In examples, pads 212 may be formed at the location where TSV connection points 210 are to be provided. In examples, pads 212 may be metal pads. In examples, pads 212 can include any suitable metal such as, for example, copper, aluminum, titanium, or any alloy or combination thereof. In examples, pads 212 may be formed by plating. In examples, pads 212 may be configured to form a Faraday cage. In examples, as illustrated, connection points 210 on interposer 200 may be provided at least along a portion of a surface 214 of an interposer 200. In examples, any arrangement of connection points 210 may be implemented as desired.

In examples, as also shown in FIG. 2A, a board assembly 238 may include one or more connection points 240. In examples, as illustrated, connection points 240 may be provided at a peripheral region 242 of a board assembly 238. In examples, connection points 240 may be provided anywhere on a surface of a board assembly 238. In examples, the size of a surface area of a surface of board assembly 238 facing an interposer 200 may be larger than, smaller than, or the same as the surface area of the surface of that of interposer 200 facing the board assembly 238. In examples, the dimensions of a board assembly 238 may be different from the dimensions of an interposer 200 to which it is connected. In examples, a board assembly 238 may have a peripheral region 242 that extends beyond a peripheral region 236 of an interposer 200 to which it is connected. In examples, where a board assembly 238 has greater dimensions than the interposer 200 to which it is connected, the connection points 240 of the board assembly 238 may be located at an internal surface area of board assembly 238 instead of at peripheral region 242. In examples, one or more connection points 240 on a board assembly 238 may be arranged so that when coupled to an interposer or other connector, at least some of the one or more connection points 240 on board assembly 238 may align with at least some of the one or more connection points 210 on interposer 200. In examples, one or more connection points 240 on a board assembly 238 may be arranged so that when coupled to an interposer 200, at least some of the one or more connection points 240 on board assembly 238 may be misaligned with at least some of the one or more connection points 210 on interposer 200.

In examples, as shown in FIGS. 1A and 1B, an interposer 200 may be used to interconnect printed circuit boards 106 and/or complementary elements 112 in similar manners. In examples, a complementary element 112 may be connect to an interposer 200 via one or more solder bumps 118. In examples, two or more complementary elements 112 may be interconnected directly using solder bumps without an interposer 200. In examples, two or more complementary elements 112 may be connected via standard connectors such as one or more flex circuits. In examples, one or more complementary elements 112 and/or any electronic component 120 provided on a complementary element 112 may be connected to any other structure, element, printed circuit board, and/or component via any of interposer 200, direct connection, and/or standard flex circuit or other traditional connector.

Figure 2B:
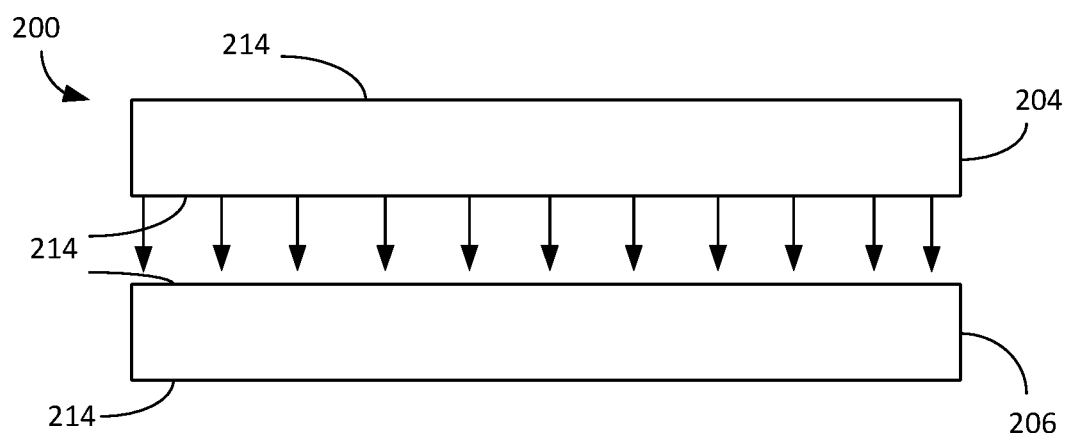
Figure 2C:
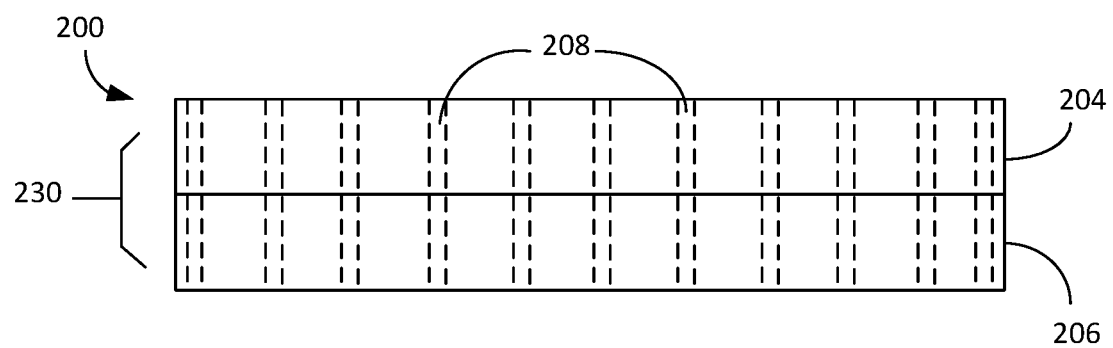

As shown in FIGS. 2A-2C, an interposer 200 may include a laminate structure 230 that defines an inner space 216. In examples, the laminate structure 230 may include laminated first mount 204 and second mount 206. In examples, first mount 204 may be bonded to second mount 206 to form the laminate structure 230. In examples, first mount 204 may be bonded to second mount 206 by any suitable means including, for example, an adhesive, thermal bonding, mechanical fasteners, or any combination thereof. In examples, interposer 200 may have surfaces 214 wherein surface 214 may include a top and bottom surface of each of first mount 204 and second mount 206. In examples, the inner space 216 may be defined by an internal boundary of the first mount 204 and second mount 206. In examples, interposers having an inner space 216 may provide additional space between consecutive board assemblies 238 to accommodate one or more electronic components 120 described later. For example, inner space 216 may accommodate one or more electronic components 120 that have a height greater than the solder bump connection between the board assembly 238 and interposer 200. In examples, inner space 216 may be at least partially occupied by a heat spreader 202.

In examples, as shown in FIGS. 2D to 2O, an interposer 200 may include and/or be equipped with a heat spreader 202. In examples, a heat spreader 202 may include at least an active portion 218. In examples, a heat spreader 202 may also include a passive portion 220.

For purposes of this disclosure, an active portion 218 of a heat spreader may include a portion of the heat spreader 202 that is configured to receive and spread thermal energy. In examples, an active portion 218 may include a vapor chamber, a heat pipe, and/or a thermally conductive body having one or more layers of thermally conductive material. In examples, a passive portion 220 of a heat spreader 202 may include an extension from the active portion 218. In examples, a passive portion 220 may be one or more layers of thermally conductive material extending from the active portion 218. In examples, a passive portion 220 may include one or more metals (e.g., titanium, aluminum, magnesium, steel, or alloys thereof), high strength polymers (such as polyamideimide (PAI), polyetherimide (PEI), polyetheretherketone (PEEK), and/or polyphenylene sulfide (PPS). In examples, passive portion 220 may include a flex circuit material, for example Kapton Tape optionally laminated with a metal such a copper. In examples, a passive portion 220 may be one or more layers of thermally conductive material thermally coupled to the active portion 218. In examples, a passive portion 220 may be formed by an extension of an outer shell of the active portion 218. In examples, a passive portion 220 may be configured to transfer heat from the active portion 218 to beyond an outer edge of interposer 200. In examples, a passive portion 220 may be thermally coupled to a heat sink or other heat dissipating structure.

In examples, as shown in FIGS. 2D to 2G a heat spreader 202 may be provided as a floating heat spreader confined within inner space 216 of interposer 200. In examples, a heat spreader 202 may be nested within inner space 216. In examples, a heat spreader 202 may be provided to fit completely within inner space 216. In examples, a heat spreader 202 as illustrated in FIGS. 2D to 2G may include an active portion 218 and no passive portion 220. In examples, the active portion 218 makes up the whole heat spreader 202 as shown in FIGS. 2D to 2G. In examples heat spreader 202 does not extend beyond an outer boundary 226 of interposer 200. In examples, the dimensions of the active portion 218 and/or of heat spreader 202 may be smaller than or equal to the dimensions of inner space 216. In examples, the thickness of the heat spreader 202 and/or active portion 218 may be smaller than the depth of inner space 216. In examples, inner space 216 may have a depth equivalent to the thickness of interposer 200. In examples, inner space 216 may have a depth of about 1 mm to 1.5 mm. In examples, heat spreader 202 and/or active portion 218 may have a thickness that is below 1 mm but greater than zero. In examples, heat spreader 202 and/or active portion 218 may have a thickness that is about half the depth of inner space 216 and/or half the thickness of interposer 200. In examples, heat spreader 202 and/or active portion 218 may have a thickness that is about 0.5 mm. In examples, one or more notches 228 or similar structure may be provided on an inner surface of interposer 200 that faces inner space 216. In examples, notches 228 may be configured to hold heat spreader 202 and/or active portion 218 of heat spreader 202.

Although illustrated at a central portion of inner space 216, heat spreader 202 and/or the active portion 218 of heat spreader 202 may be located at any depth within inner space 216.

In examples, when interposer 200 with floating heat spreader 202 is positioned between two PCBs 106, complementary elements 112, or a combination thereof, the heat spreader 202 and/or active portion 218 thereof may be configured be thermally coupled to one or more PCBs and/or complementary elements connected to interposer 200 and/or to any electronic component 120 provided on any such PCB and/or complementary element. In examples, the thermal coupling may be done by physical contact, physical proximity, and/or by way of a thermally conductive intermediary material that is provided between the heat spreader 202 and/or active portion 218 thereof and the one or more PCBs, complementary element, and/or electronic component 120 provided thereon.

Figure 2D:
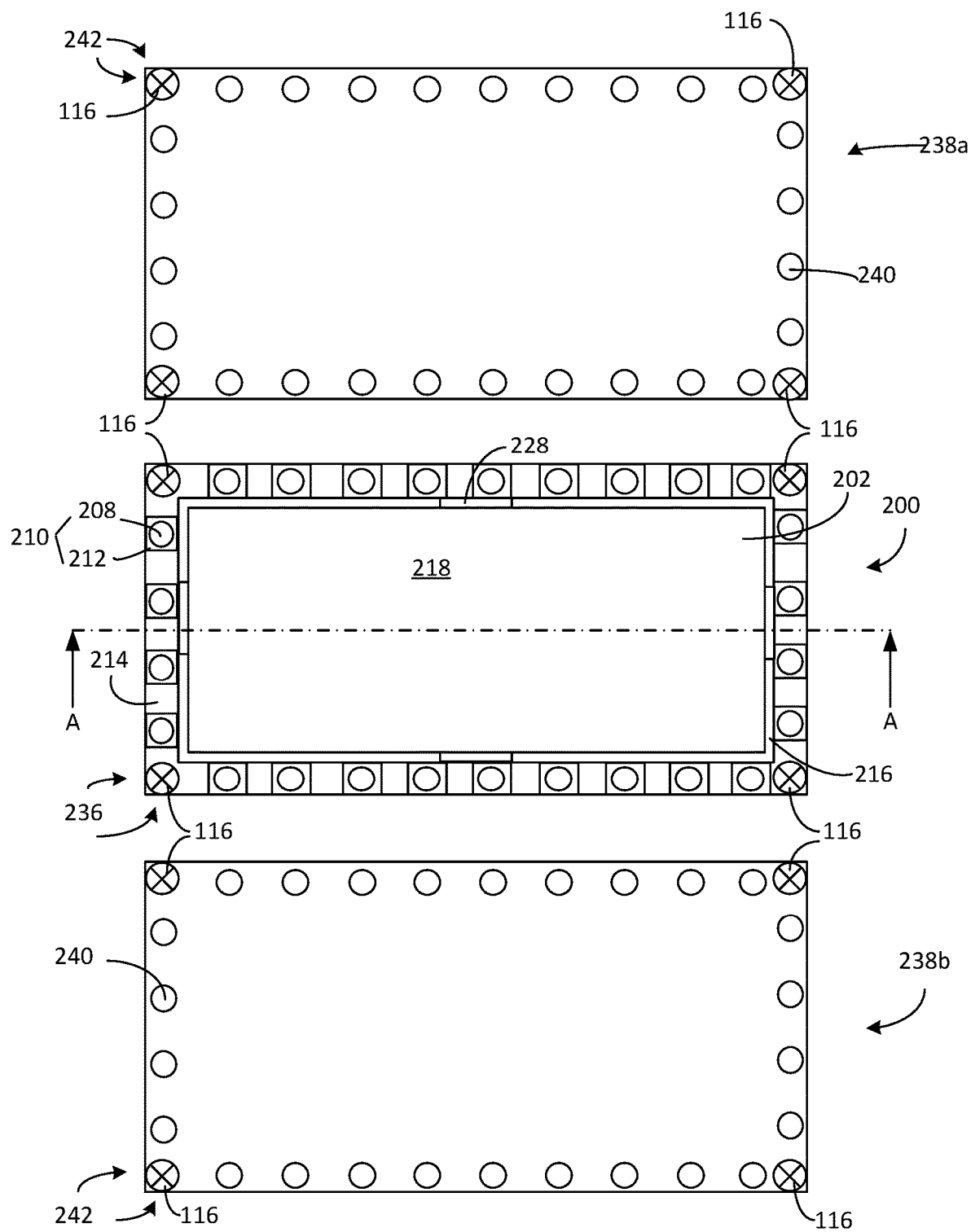

In examples, a floating heat spreader 202 and/or active portion 218 thereof as illustrated in FIG. 2D may be configured to spread thermal energy isothermally.

Figure 2E:
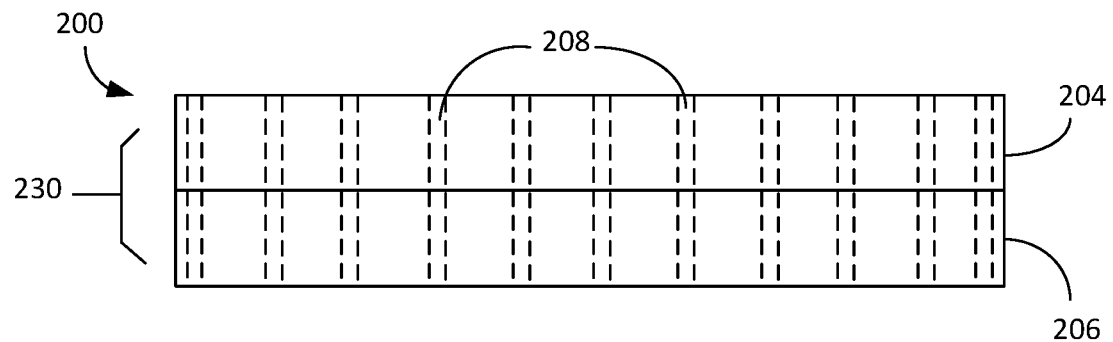

FIG. 2E illustrates a side view of an example interposer 200 with a floating heat spreader 202. As illustrated, interposer 200 may include a first mount 204 laminated to a second mount 206. In examples, the heat spreader 202 and/or active portion 218 thereof may be thinner than the inner space 216 defined at an interior region of the interposer and thus is not shown. In examples, the one or more through chip vias 208 are shown in broken lines as they traverse through the laminated first mount 204 and second mount 206.

Figure 2F:
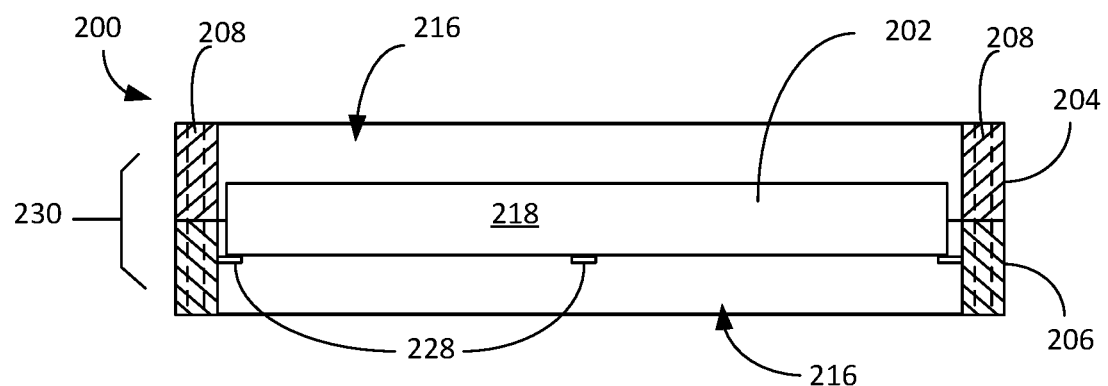
Figure 2G:
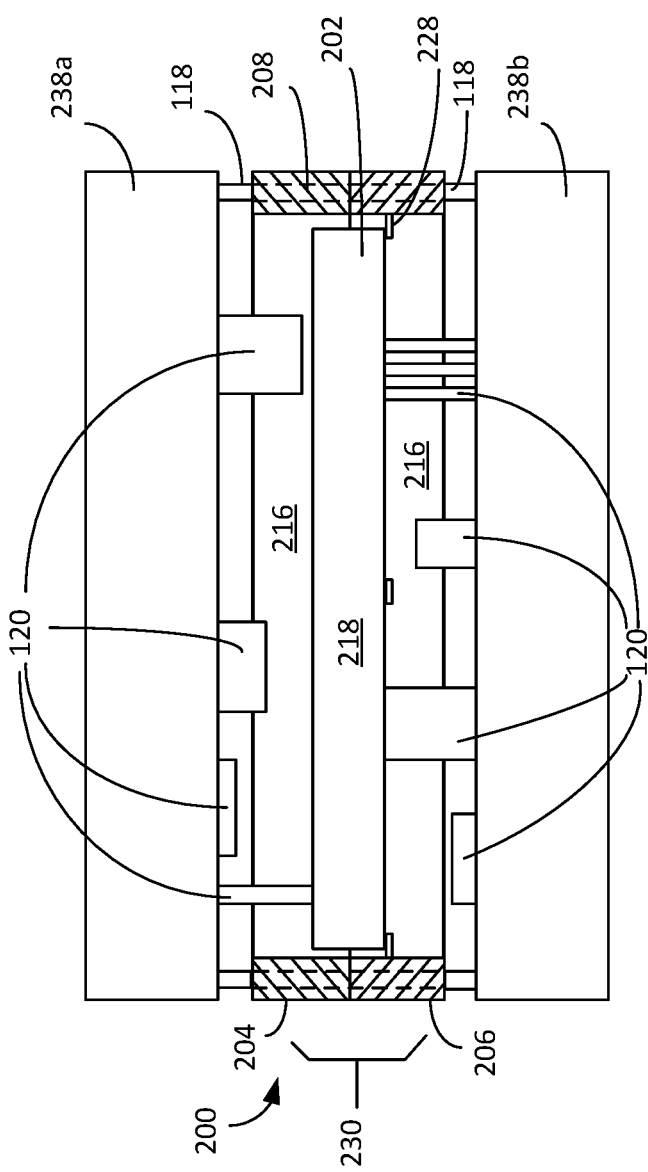

FIGS. 2F and 2G illustrate a cross-section view taken at cross-sectional line A-A in FIG. 2D. In examples, the first mount 204 is shown as laminated to second mount 206 to form interposer 200 that includes an inner space 216. As shown, floating heat spreader 202 and/or active portion 218 thereof may be provided inside inner space 216 and sustained by one or more notches 228. As illustrated, floating heat spreader 202 and/or active portion 218 thereof may have a thickness that is less than the depth of inner space 216. In examples, the additional space in inner space 216 provided by the thickness differential with the heat spreader 202 and/or active portion 218 thereof may be configured to accommodate one or more electronic components 120 provided on a PCB or complementary element connected to interposer 200 as for example illustrated in FIG. 2G. In examples, inner space 216 may have a depth equivalent to the thickness of interposer 200. In examples, inner space 216 may have a depth of about 1 mm to about 1.5 mm. In examples, heat spreader 202 and/or active portion 218 may have a thickness that is below 1 mm but greater than zero. In examples, heat spreader 202 and/or active portion 218 may have a thickness that is about half the depth of inner space 216 and/or half the thickness of interposer 200. In examples, heat spreader 202 and/or active portion 218 may have a thickness that is about 0.5 mm.

In examples, as shown in FIGS. 2H to 2O, a heat spreader 202 may include an active portion 218 and a passive portion 220. In examples, the active portion 218 may be provided within the confines of inner space 216. In examples, a passive portion 220 may be present in inner space 216 and/or beyond an outer boundary of interposer 200.

In examples, the active portion 218 may be the same as or similar to the structure described earlier with respect to a floating heat spreader 202 described with reference to FIGS. 2D to 2G. In examples, active portion 218 may include a vapor chamber, heat pipe, and/or isothermal plate. In examples, active portion 218 of heat spreader 202 may be confined within the boundaries of inner space 216. In examples, active portion 218 may have a thickness that is less than the depth of inner space 216. In examples, inner space 216 may have a depth equivalent to the thickness of interposer 200. In examples, inner space 216 may have a depth of about 1 mm to 1.5 mm. In examples, heat spreader 202 and/or active portion 218 may have a thickness that is below 1 mm but greater than zero. In examples, heat spreader 202 and/or active portion 218 may have a thickness that is about half the depth of inner space 216 and/or half the thickness of interposer 200. In examples, heat spreader 202 and/or active portion 218 may have a thickness that is about 0.5 mm.

In examples, heat spreader 202 and/or the active portion 218 of heat spreader 202 may be located at any depth within inner space 216. For example, as illustrated in FIGS. 2H to 2K, the active portion 218 of a heat spreader 202 may be provided close to one end of the opening. Alternatively, in FIGS. 2L to 2O, the active portion 218 of a heat spreader 202 may be provided at a central depth of inner space 216 like it was described with reference to FIGS. 2D to 2G.

In examples, a passive portion 220 may extend from one or more sides of active portion 218. In examples, passive portion 220 of a heat spreader 202 may have a thickness that is less than the thickness of the active portion 218 and greater than zero. In examples, as previously described, the additional space in inner space 216 provided by the thickness differential with the heat spreader 202 and/or active portion 218 thereof may be configured to accommodate one or more electronic components 120 provided on a PCB or complementary element connected to interposer 200 as for example illustrated in FIGS. 2K and 2O.

For example, as illustrated in FIGS. 2H to 2K, a passive portion 220 may be formed as one or more pigtails or wing extensions 222 that extends from one or more sides of the active portion 218. In examples, pigtails or wing extension 222 may extend beyond the outer boundary 226 of interposer 200. In examples, pigtails or wing extensions 222 may be a single protrusion as shown by 222a or a group of protrusions as shown by 222b from one or more sides of active portion 218. In examples, two or more protrusions 222 may also be coplanar or on different planes as shown in FIGS. 2H to 2K. In examples, the one or more pigtails or wing extensions 222 may be formed by extending at least a portion of active portion 218. In examples, the one or more pigtails or wing extensions 222 may be formed by extending at least a portion of an outer shell of active portion 218. In examples, as shown by the two or more protrusions 222*b* may extend from at least two different portions of active portion 218.

In examples, a pigtail or wing extension 222 may extend between at least a portion of first mount 204 and second mount 206 that make up interposer 200. In examples, a pigtail or wing extension 222 may be laminated between the first mount 204 and the second mount 206. In examples, a pigtail or wing extension 222 may extend over at least a portion of a surface of either a first mount 204 and/or second mount 206. In examples, a recess may be formed, for example by etching and/or laser ablation, at a surface 214 of the first mount 204 and/or second mount 206 to accommodate for the thickness of a pigtail or wing extension 222. In examples, a recess may be formed at an inner and/or outer surface 214 of first and second mounts 204 or 206, wherein an outer surface is one that faces away from the other mount and an inner surface is one that faces the other mount, i.e. the surface at which the two mounts are laminated. In examples, not shown, a recess is not provided and a gap or spacing may be formed between the first and second mounts 204 and 206, the gap or spacing being occupied at least in part by a portion of heat spreader 202 and/or passive portion 220 of heat spreader 202 such as for example one or more pigtails or wing extensions 222. In examples, one or more through chip vias 208 at connection points 210 may be formed through a pigtail or wing extension 222 as for example shown in FIG. 2I-2K.

In examples, as shown for example by 222*a*, a pigtail or wing extension 222 may be configured to block one or more connection points 210 and/or through chip vias 208. In examples, one or more through chip vias 208 at one or more connection points 210 may be formed through a pigtail or wing extension 222 that would otherwise block the connection point 210 and/or through chip vias 208. In examples, as for example shown by 222*b*, a pigtail or wing extension 222 may be configured to extend between two or more connection points 210 and/or through chip vias 208. Any combination of these may be implemented.

In examples, a pigtail or wing extension 222 may be coupled at a far end outside the outer boundary 226 of interposer 200 to a heat dissipating structure 232. In examples, a heat dissipating structure 232 may include a heat sink. In examples, a heat dissipating structure 232 may include at least a portion of an outer frame of an electronic device in which the interposer 200 equipped with heat spreader 202 and/or the stack-PCT architecture including an interposer 200 equipped with heat spreader 202 may be used. Any combination of various heat dissipating structures 232 may also be employed.

Figure 2H:
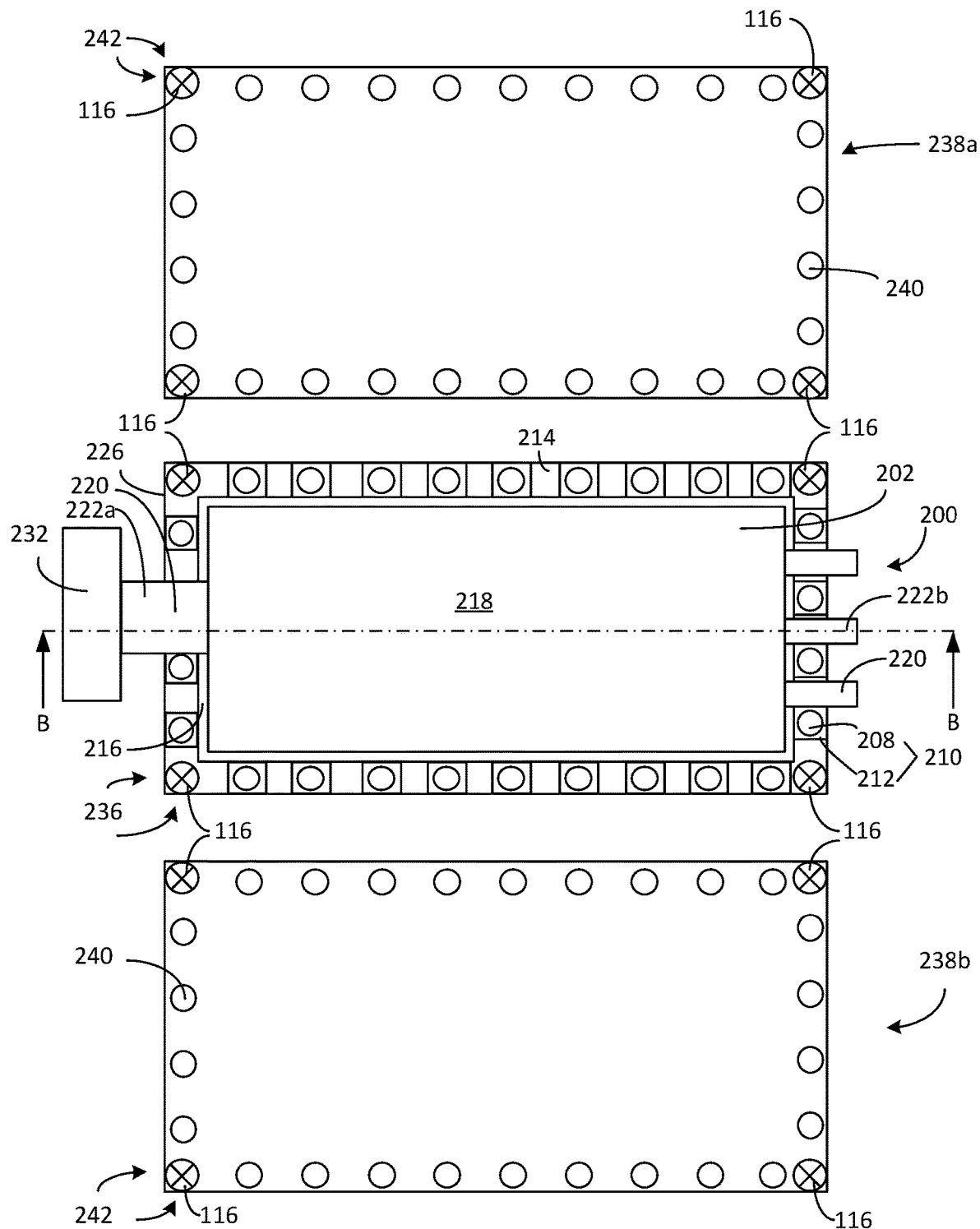
Figure 2I:
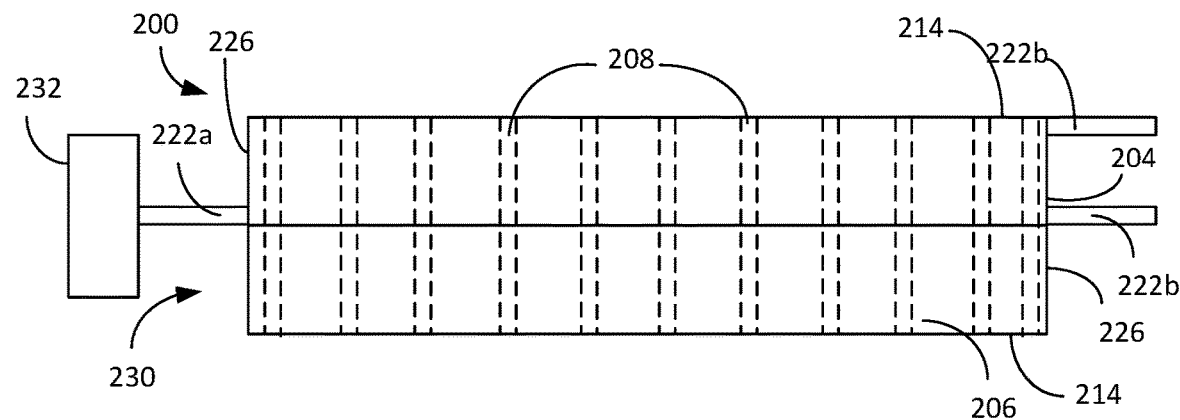

FIG. 2I illustrates an example of a side view of an interposer 200 from a side where no pigtails or wing extensions 222 are present and shows how pigtails or wing extensions 222 from two other sides can extend out from the outer boundary 226 of interposer 200. In examples, the pigtails or wing extensions 222 may extend out at only one side of interposer 200, or at two or more sides of interposer 200.

Figure 2J:
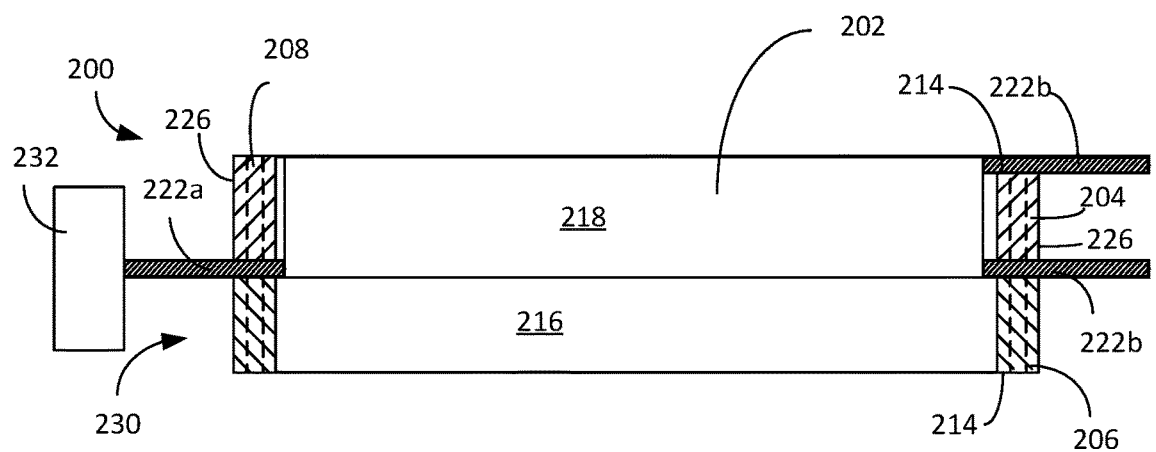
Figure 2K:
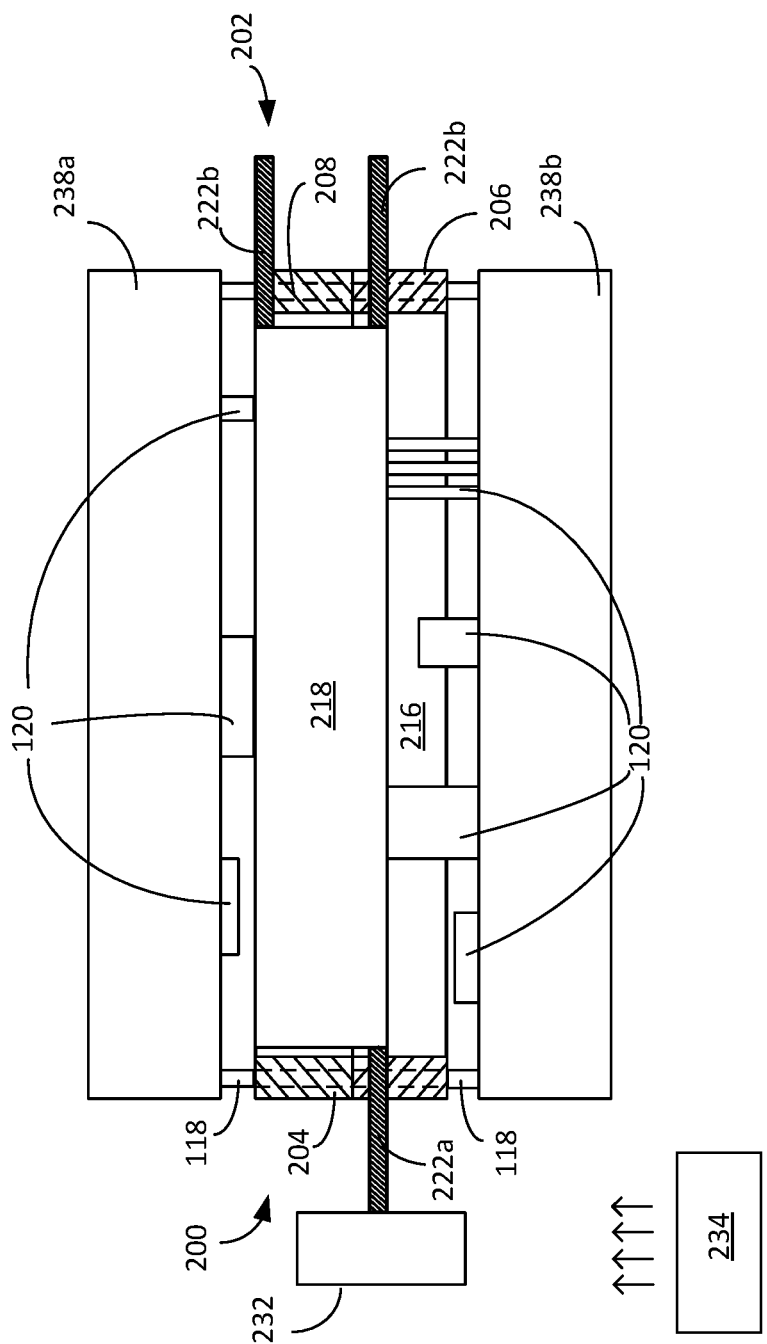

FIGS. 2J and 2K illustrate a cross-section view taken at cross-sectional line B-B in FIG. 2H without and with coupled PCBs 106*a* and 106*b*. As shown, in examples, a pigtail or wing extension 222 may extend and be laminated between a first mount 204 and second mount 206 that form interposer 200. As also shown, a pigtail or wing extension 222 may extend from at least a portion of inner space 216 to beyond outer boundary 226 of interposer 200. In examples, a pigtail or wing extension 222, as shown, may be connected to, be an extension of, and/or be thermally coupled to active portion 218 of heat spreader 202.

In examples, as shown in FIGS. 2L to 2O, a passive portion 220 may include a peripheral skirt 224. In examples, a peripheral skirt 224 may be formed in a similar manner as a pigtail or wing extension 222 except that it may extend out continuously from the full perimeter of active portion 218. In examples, peripheral skirt 224 may be formed of one or more layers either connected to, thermally coupled to, and/or extending from active portion 218 as also described with reference to pigtails or wing extensions 222.

In examples, as illustrated, peripheral skirt 224 may extend from at least a portion of the inner space 216 of interposer 200 to beyond an outer boundary 226 of interposer 200. In examples, peripheral skirt 224 may be extend and/or be laminated between the first mount 204 and the second mount 206 that make up interposer 200 as for example shown in FIGS. 2N and 2O that shows a cross-sectional view taken at cross-sectional line C-C in FIG. 2L without and with coupled PCBs 106*a* and 106*b*. In examples, peripheral skirt 224 may extend over at least a portion of a surface of the first mount 204 or second mount 206 and not be laminated between the first and second mounts 204 and 206 as previously illustrated with respect to the pigtails or wing extensions 222. In examples, a recess may be formed at a surface 214 of the first mount 204 and/or second mount 206 to accommodate for the thickness of the peripheral skirt 224. In examples, a recess may be formed at an inner and/or outer surface 214 of first and second mounts 204 or 206, wherein an outer surface is one that faces away from the other mount and an inner surface is one that faces the other mount, i.e. the surface at which the two mounts are laminated. In examples, not shown, a recess is not provided and a gap or spacing may be formed between the first and second mounts 204 and 206, the gap or spacing being occupied at least in part by a portion of heat spreader 202 and/or passive portion 220 of heat spreader 202 such as for example peripheral skirt 224. In examples, one or more through chip vias 208 at connection points 210 may be formed through peripheral skirt 224 as for example shown in FIG. 2M-2O.

In examples, although illustrated in regular shape, peripheral skirt 224 may have any desired shape and extend either uniformly or at varying lengths from the periphery of active portion 218. In examples, peripheral skirt 224 may be configured to be thermally coupled to one or more heat dissipating structures 232 as previously described.

In examples, system stack 104 with one or more interposers 200 equipped with a heat spreader 202 may be arranged with the intention of maintaining an isothermal state across the stack-PCB architecture. In examples, the printed circuit board 106 that is part of system stack 104 that produces the greatest amount of heat compared to the one or more other printed circuit boards 106 that make up system stack 104 may be located adjacent to an interposer 200 that is equipped with a heat spreader 202. In examples, system stack 104 may be arranged so that system on chip printed circuit board is adjacent an interposer 200 that includes a heat spreader 202. In examples, the system on chip printed circuit board may be thermally coupled to a heat spreader 202 provided in an interposer 200.

In examples, a heat spreader 202 may include an isothermal structure configured to absorb heat from one or more electronic components 120, a PCB 106, and/or a complementary element 112 and redistribute it more evenly and/or help dissipate heat by transferring it to a heat sink or like structure. In examples, heat spreader 202 may include any type of isothermal structure able to redistribute and/or transfer or dissipate heat. In examples, heat spreader 202 may include an isothermal plate. In examples, heat spreader 202 may include a heat pipe or a structure such as a frame including one or more heat pipes. In examples, heat spreader 202 may include a plate with a graphite core. In examples, heat spreader 202 may include titanium.

In examples, heat spreader 202 may include a vapor chamber. Any type of vapor chamber may be employed. In examples, the vapor chamber may be formed of titanium. In examples, the vapor chamber may include one or more other materials in addition to and/or in place of titanium. For example, the vapor chamber may include aluminum, magnesium, graphite, copper, plated copper, solid metal slab lined with pyrolytic graphite, or any combination thereof.

In examples, the active portion 218 of a heat spreader 202 may include an isothermal plate, a heat pipe, and/or a vapor chamber as described herein. In examples, the passive portion 220 of a heat spreader 202 may include one or more layers of thermally conductive material. In examples, a passive portion 220 may include an extension of a shell wall of a heat pipe or vapor chamber that make up active portion 218.

FIG. 3 illustrate a diagrammatic view of example vapor chambers or heat pipes and related operation. In examples, a vapor chamber 300 may include a shell 302, a steam chamber 304, a wick 306, and a liquid 308. In examples, heat input into the vapor chamber may cause the liquid 308 to evaporate from the wick 306 and fill the steam chamber 304 thus redistributing the heat across the whole chamber. As the liquid 308 cools, it may condense and return to the wick 306. In examples, the wick 306 may include copper, titanium, aluminum, or any combination thereof. In examples wick 306 may include a microporous structure that is able to collect condensate through capillary action. In examples, a wick 306 may include a mesh structure, a fiber structure, or a combination thereof that is inserted inside the vapor chamber or heat pipe prior to the vapor chamber or heat pipe being fully sealed. In examples, wick 306 may include a set of channels etched on an internal wall of shell 302 as described below. In examples, the liquid 308 can be water or H$_2$O. Other liquids may also be employed. In examples, shell 302 may include one or more bonded sheets of material made of metals (e.g., titanium, aluminum, magnesium, steel, or alloys thereof), high strength polymers (such as polyamideimide (PAI), polyetherimide (PEI), polyetheretherketone (PEEK), and/or polyphenylene sulfide (PPS), Nylon, with or without fiber reinforcement, and/or composites such as carbon fiber or fiberglass. In examples, shell 302 may include a flex circuit material, for example Kapton Tape optionally laminated with a metal such a copper. In examples, a passive portion 220 of a heat spreader 202 may be an extension of one or more sheets that form shell 302 of a vapor chamber or heat pipe that make us the active portion 218 of a heat spreader 202. In some examples, the shell may include internal vessels or "channels" etched throughout all or part of an inner wall of the shell to hold a working fluid (e.g., water, glycol/water solutions, alcohol, acetone, dielectric coolants, etc.) that may be used to actively remove heat from components coupled to the shell. In examples, a vapor chamber or heat pipe may be charged with a working fluid via an orifice that can be sealed after the fluid has been injected. In some examples, the working fluid may be circulated through the channels via capillary action and thermal differentials throughout the shell. In examples, a vapor chamber 300 may be coupled to a heat dissipating structure 310. As previously described, a heat dissipating structure may have any suitable design and/or may include an outer frame of the electronic device in which the interposer 200 with heat spreader 202 is used. As illustrated in FIG. 3, a heat dissipating structure 310 may include a heat sink. As shown, a heat sink 310 may include one or more fins 312.

Figure 4:
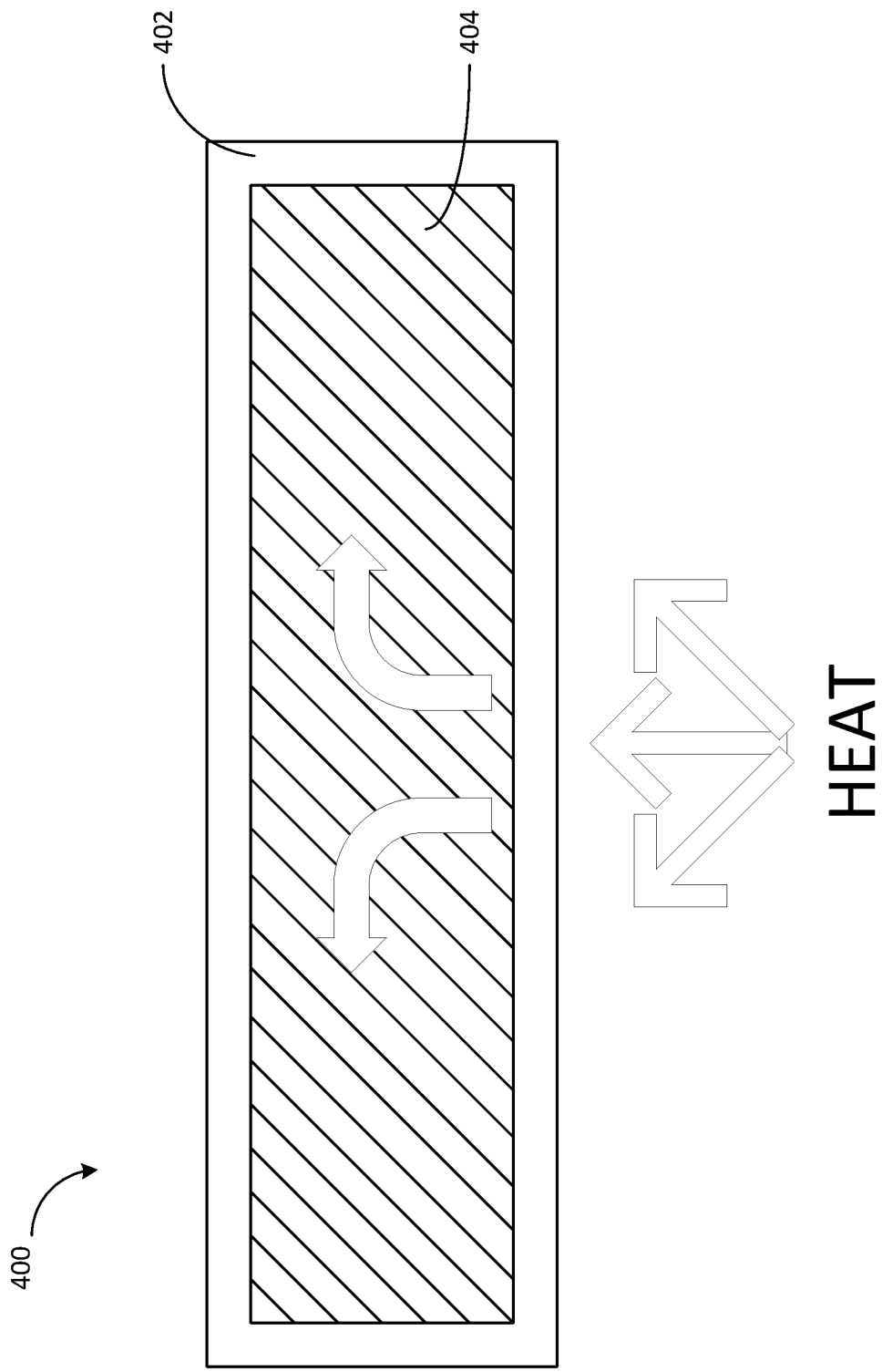
FIG. 4 illustrates a diagram of an example heat spreader plate with a graphite core or layer that can be used in connection with a stack-PCB architecture such as that shown in FIG. 1.

FIG. 4 illustrates a diagram of an example active portion of a heat spreader 400 including a plate structure 402, for example an isothermal plate, including a metal, ceramic, a composite, or any combination thereof, with a graphite core 404 encapsulated into the plate structure. In examples, the graphite can include annealed pyrolytic graphite. In examples, as shown, heat is transferred to the plate structure 402 and into the graphite core. Graphite may exhibit high thermal conductivity and thus may be able to then spread the heat across the overall graphite core and/or plate structure.

As illustrated in FIGS. 1A and 1B, by using one or more interposers 200, it may be possible to eliminate flex circuits from the stack-PCB architecture. This may lead to a less cluttered packaging and improved airflow. In examples, the short and more direct connections achievable by one or more interposers 200 may also lead to minimized signal delay and/or signal noise. In examples, one or more interposer 200 may be equipped with one or more heat spreader 202 as described earlier and be configured to transfer, distribute, and/or diffuse heat and improve heat diffusion across the stack-PCB architecture, and thus may improve isothermal conditions of the stack-PCB architecture.

In examples, an interposer 200 as described may be configured to allow for direct transfer of a heat between an electronic component 120 and a heat spreader 202 and/or active portion 218 of a heat spreader 202. In examples, as illustrated, an electronic component 120a and/or an electronic component 120b may be provided on a printed circuit board 106 and/or complementary element 112 an extend to contact an active portion 218 of a heat spreader 202.

Figure 2L:
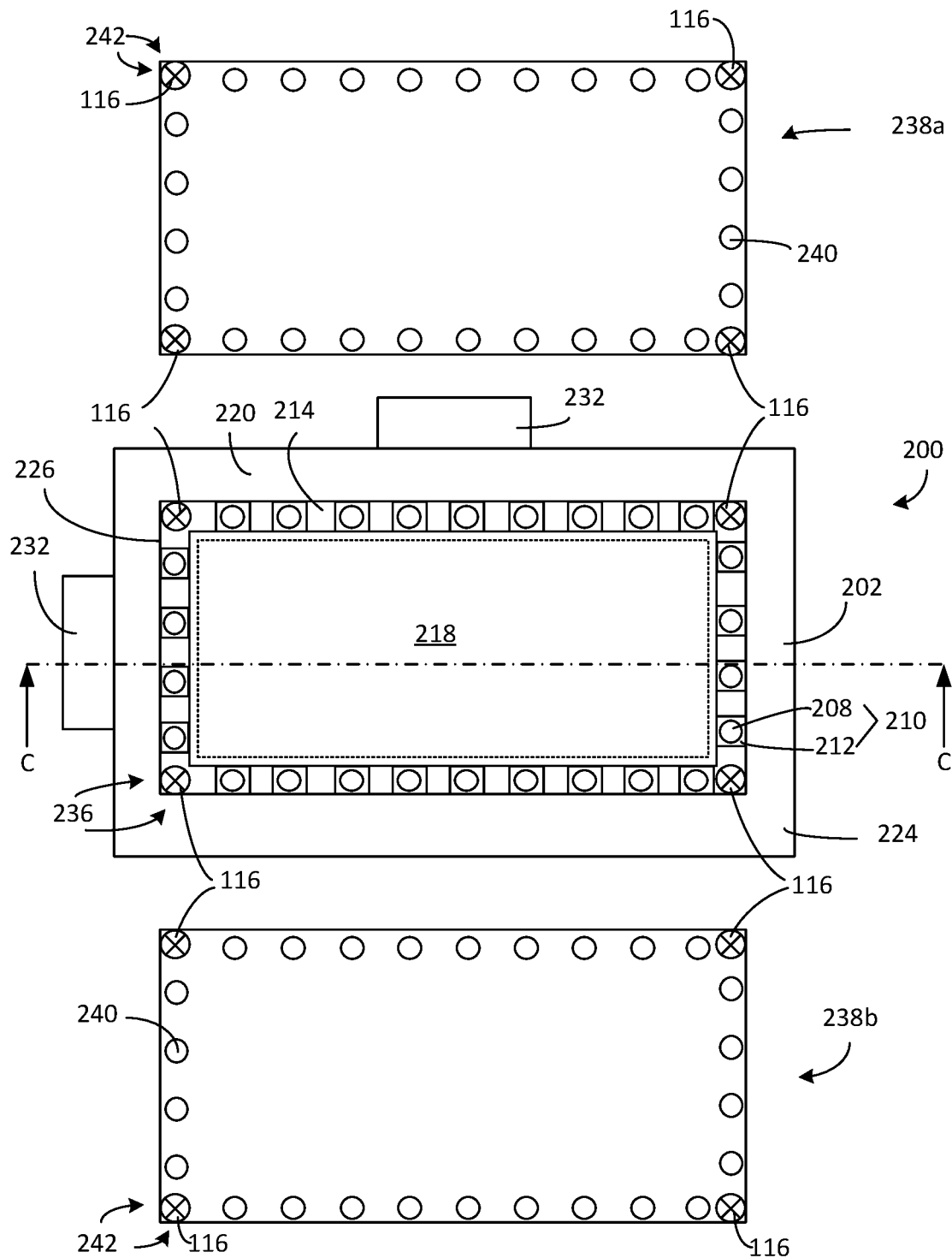
Figure 2M:
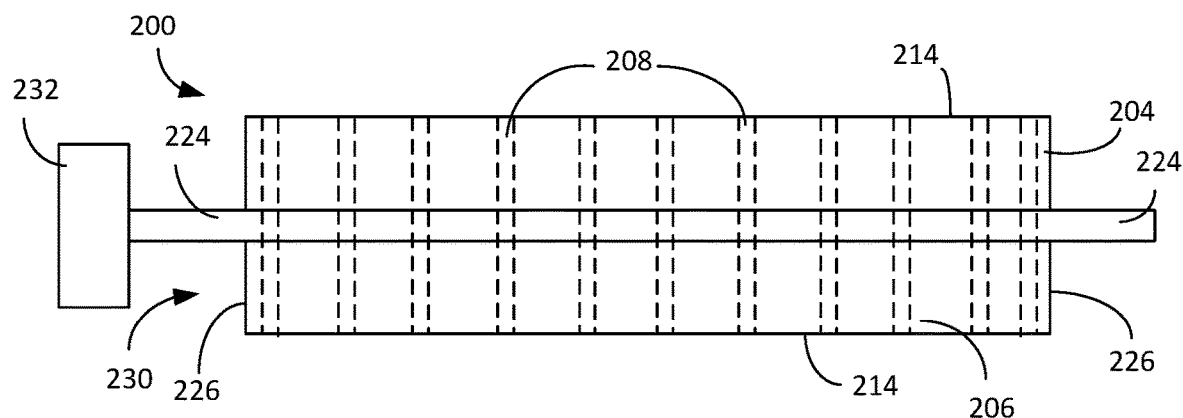
Figure 2N:
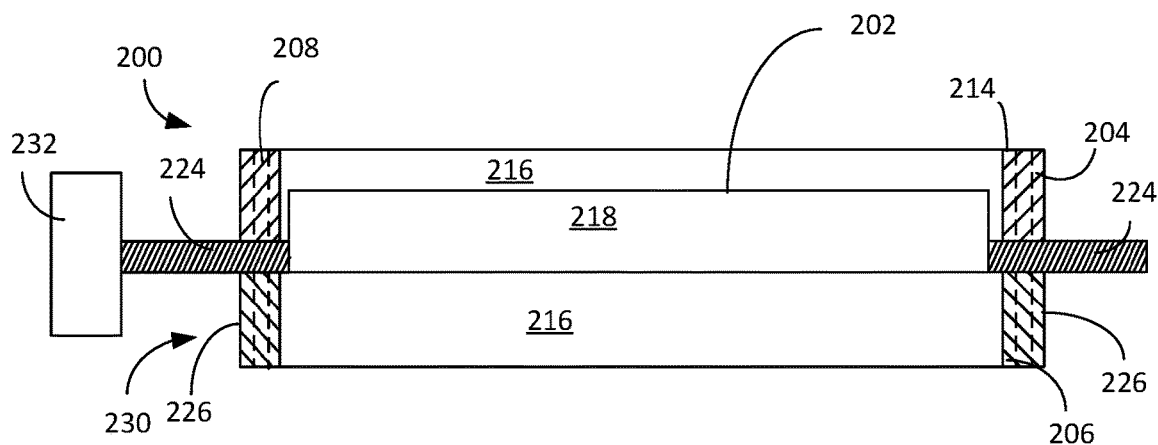
Figure 20:
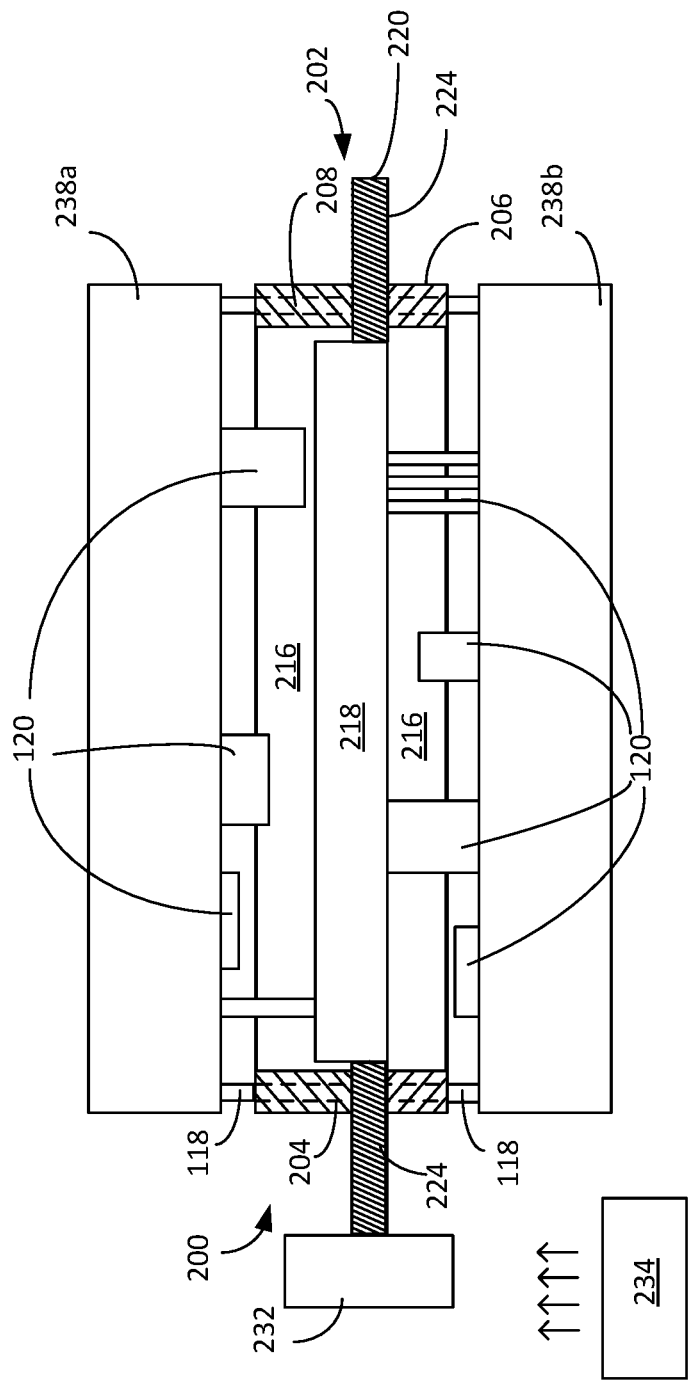

In examples, a heat spreader 202 may be thermally coupled to one or more heat dissipating structures 232. In examples, a computing device employing a stack-PCB architecture 100 may include one or more heat dissipating structures 232. In examples, as shown in FIGS. 2H and 2L, heat dissipating structure 232 may be coupled to one or more portions of a passive portion 220 of a heat spreader 202. In examples, one or more dissipating structures 232 may further be thermally coupled to a printed circuit board 106, a complementary element 112, an electronic component 120, or any combination thereof. In examples, a heat dissipating structure 232 may assist in dissipating heat from heat spreader 202 and/or stack-PCB architecture 100. In examples, a heat dissipating structure 232 may be arranged to transfer heat from at least a portion of the heat spreader 202 and/or stack-PCB architecture 100 to a housing or other structure proximate to and/or surrounding interposer 200 and/or the stack-PCB architecture 100. In examples, a heat dissipating structure 232 may include a heat exchanger configured to transfer heat. In examples, heat dissipating structure 232 may include one or more fins. In examples, heat dissipating structure 232 may include a thermally conductive material. In examples, heat dissipating structure 232 may include aluminum.

In examples, a heat dissipating structure 232 may be employed in conjunction with a fan or like venting device 234 as for example shown in FIGS. 2K and 2O. In examples, a fan may be arranged to efficiently cause air flow across the heat dissipating structure 232. In examples, a computer fan and a heat dissipating structure 232 may be arranged so that maximum air flow may pass across the surface of the heat dissipating structure 232 to maximize heat dissipation. Maximizing air flow across heat dissipating structure 232 may increase the cubic feet per minute rate of air flow through the computing package and thus improve the cooling of the stack-PCB architecture and/or components thermally coupled to heat spreader 202.

In examples, a fan 234 may be arranged so that the stack-PCB architecture and/or heat dissipating structure 232 may be arranged to be aligned with the airflow caused by the fan. In examples, the fan 234 may be arranged and/or aligned so that airflow caused by the fan may be directed to flow across a surface of the heat dissipating structure 232.

In examples, one or more heat dissipating structures 232 may be connect to and/or thermally coupled to a heat spreader 202 by any suitable means. In examples, the connection and/or thermal coupling may be made via thermal adhesive and/or thermal paste. In examples, the connection and/or thermal coupling may be made via a thermally conductive epoxy compound, silicon compound, or any combination thereof. In examples, the connection and/or thermal coupling may be made via one or more mechanical fasteners such as screws, bolts, fitting, clips, clamps, rivets, push pins, brackets, or other like device. Any combination of adhesive, paste, and mechanical fastener may also be employed.

Figure 5A:
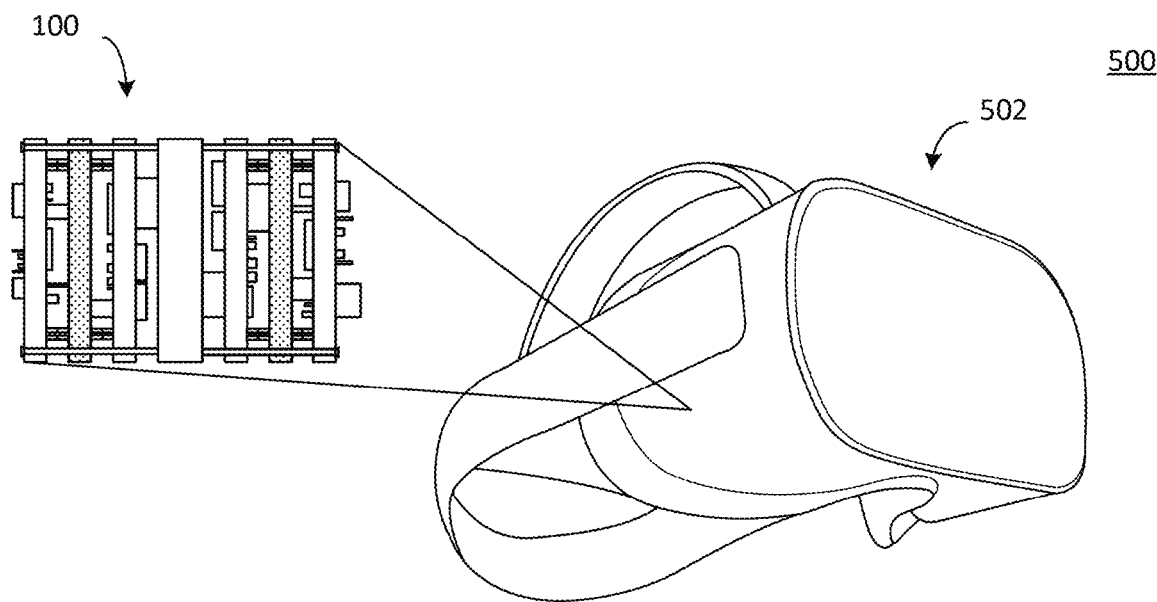
FIGS. 5A and 5B illustrate product implementation examples for a stack-PCB architecture as described herein.
Figure 5B:
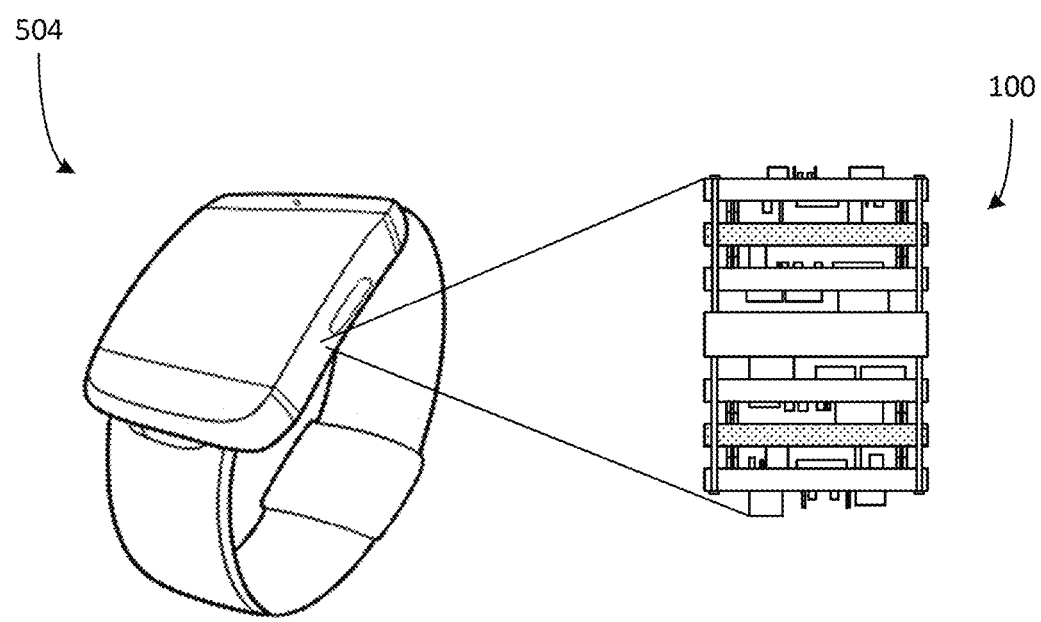

FIGS. 5A and 5B illustrate examples of computing device 500 in which an interposer 200 equipped with a heat spreader 202 as described and/or the above-described stack-PCB architecture 100 with one or more interposers 200 equipped with heat spreader 202 may be employed. The computing device 500 may be any computing device as previously stated. In examples, the disclosed interposer 200 equipped with heat spreader 202 and/or stack-PCB architecture including one or more interposers 200 equipped with heat spreader 202 may be employed in portable computing devices such as wearable devices such as a smart watch, augmented reality computing devices, virtual reality computing devices, extended reality computing devices such as headsets and glasses, mobile phones, handheld computers, cameras, gaming devices, laptops or other portable computing devices. In examples, the disclosed interposer 200 equipped with heat spreader 202 and/or stack-PCB architecture including one or more interposers 200 equipped with heat spreader 202 may be employed in non-portable computing devices such as desktop computers, appliances, integrated computing components and the like. As shown in FIG. 5B, computing device 500 may include, be a part of, or function in conjunction with a virtual reality device such as for example, a virtual reality headset 502 or wearable computing device such a smart watch 504. These are only examples.

In examples, the disclosed interposer 200 equipped with heat spreader 202 and/or stack-PCB architecture including one or more interposers 200 equipped with heat spreader 202 as described may be well suited for augmented reality (AR) and/or virtual reality (VR) devices. AR and VR devices often require high processing powers that can generate high temperatures. This is particularly when the device is shrunk to a wearable size or smaller. In examples, employing an interposer 200 equipped with heat spreader 202 and/or stack-PCB architecture including one or more interposers 200 equipped with heat spreader 202 as described can improve the utilization of a stack PCB structure in AR and/or VR devices. In examples, the ability to employ an interposer 200 equipped with heat spreader 202 and/or stack-PCB architecture including one or more interposers 200 equipped with heat spreader 202 as described in an AR and/or VR computing device may be due at least in part to the isothermal conditions that may be maintained. In examples, an AR and/or VR computing device includes one or more interposers 200 equipped with heat spreaders 202 and/or stack-PCB architectures including one or more interposers 200 equipped with heat spreader 202 as described herein.

Figure 6:
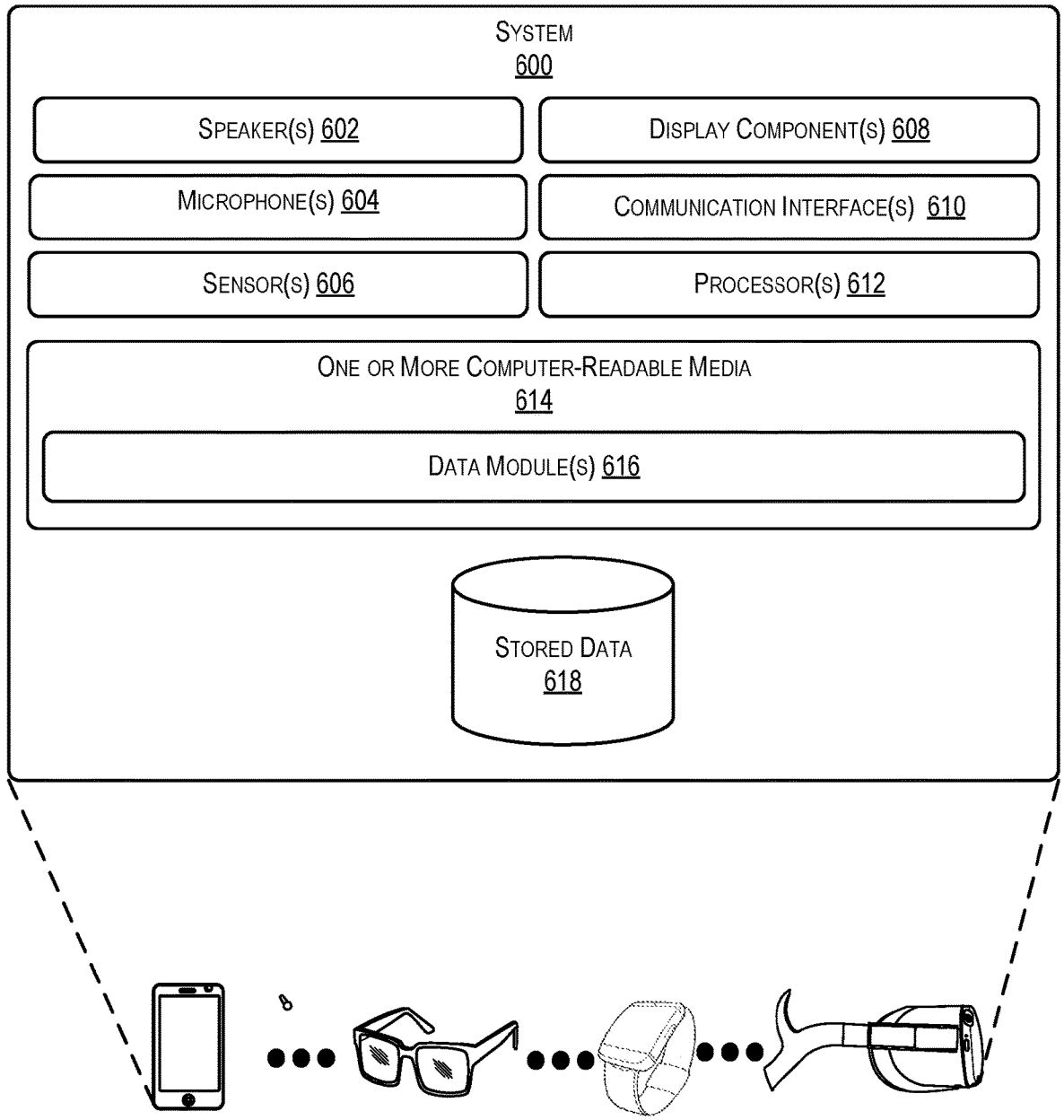
FIG. 6 is an example system that may be implemented using a stack-PCB architecture as described herein.

FIG. 6 is an example system 600 that may be implemented employing an interposer 200 equipped with a heat spreader 202 as described and/or one or more of the above-described stack-PCB architectures 100 with one or more interposers 200 equipped with heat spreader 202. The system 600 is simply an example and not intended to limit the application of the interposer 200 equipped with heat spreader 202 and/or stack-PCB architecture 100 including one or more interposers 200 equipped with heat spreader 202. In examples, multiple interposers 200 equipped with heat spreaders 202 and/or stack-PCB architectures 100 including one or more interposers 200 equipped with heat spreader 202 may be employed to provide the logic to support one or more components of system 600. In examples, using more than one stack-PCB architecture 100, each stack-PCB architecture 100 may include one or more interposers 200 equipped with heat spreader 202. In examples, using two or more stack-PCB architectures 100, any two or more stack-PCB architectures 100 may be in communication with each other and/or interconnected. Connections between stack-PCB architectures 100 may be provided via any suitable means including flex circuits, rigid connectors, cables, or any similar device. In examples, connections between stack=PCB architectures 100 may be provided via an interposer 200 equipped with heat spreader 202.

In examples, system 600 may be configured to perform various functions. In the illustrated example, system 600 may be configured to provide or deliver visual and/or audio content to a user engaged with a headset device and/or one or more earbuds. In some cases, the system 600 may include a speaker 602 which may incorporate one or more drivers as described herein, where the speaker 602 and/or driver is in proximity to or shares a structure/substrate with a microphone 604.

In examples, a microphone 604 may be configured to generate audio data and/or an audio signal representative of noise or sound in an associated environment, such as the environment surrounding a user, an ear canal of a user, and the like. In some instances, the microphone may be configured to detect noise or sound originating from a particular direction or specific relative areas (such as a mount of a user). In examples, one or more sensing components of microphone 604 may be implemented either as a functional printed circuit board and/or as a sensors board provided as a complementary element 112.

The system 600 may also include one or more sensors 606 or other device for generating vibrational data associated with the system 600. For example, in some cases, the sensors 606 may comprise one or more IMUS, accelerometers, gyroscopes, magnetometers, or a combination thereof. For instance, in one implementation, sensors 606 may comprise three accelerometers placed orthogonal to each other, three rate gyroscopes placed orthogonal to each other, three magnetometers placed orthogonal to each other, and a barometric pressure sensor to provide mechanical vibration data or signals along three axes. In examples, the sensor boards operational in the one or more sensors 606 may also be implemented as either a functional printed circuit board, or as a complementary element 112. In examples, one or more sensors logics may be included in a system on chip printed circuit board.

In some examples, the system 600 may also include display components 608 for providing or presenting visual content to a user. For example, the display components 608 may present two-dimensional visual content or three-dimensional visual content (such as virtual reality content, mixed reality content, or augmented reality content). The display components 608 may be reflective, emissive, or a combination of both. In some examples, the display components 608 may include electrophoretic displays, interferometric modulator displays, cholesteric displays, backlit liquid crystal displays (LCDs), light emitting diode (LED) displays, waveguides, and so forth. In examples, display logic associated with display components 608 may include one or more heavy load electronic components 120. In examples, the electronic components 120 associated with display components 608 may be provided on a separate printed circuit board 106 and/or complementary element 112. In examples, the printed circuit board 106 and/or complementary element 112 hosting the one or more electronic components 120 of display component 608 may be arranged closer to a heat spreader 202 and/or an active portion 218 of a heat spreader 202 provided in an interposer 200 relative to one or more other printed circuit boards 106 and/or other complementary elements 112 of a given stack-PCB architecture.

In examples, system 600 may include one or more communication interfaces 610 configured to facilitate communication between one or more networks, one or more cloud-based system, and/or one or more physical objects, such as hand-held controller. The communication interfaces 610 may also facilitate communication between one or more wireless access points, a master device, and/or one or more other computing devices as part of an ad-hoc or home network system. The communication interfaces 610 may support both wired and wireless connection to various networks, such as cellular networks, radio, WiFi networks, short-range or near-field networks (e.g., Bluetooth®), infra-red signals, local area networks, wide area networks, the Internet, and so forth. In some cases, the communication interfaces 610 may be configured to couple the earbuds wirelessly and communicatively to the headset device. In examples, communication interface 610 may include logics mounted onto a functional printed circuit board, such as for example an RF board, and/or a complementary element 112 of a stack-PCB architecture 100 with one or more interposers 200 equipped with heat spreader 202.

In examples, system 600 may also include one or more processors 612, such as at least one or more access components, control logic circuits, central processing units, or processors, as well as one or more computer-readable media 614 to perform the function associated with the virtual environment. Additionally, each of the processors 612 may itself comprise one or more processors or processing cores. In examples, one or more processors 612 may be provided on a system on chip printed circuit board of a stack-PCB architecture 100 with one or more interposers 200 equipped with heat spreaders 202. In examples, the one or more processors 612 can include any suitable processor depending on the application for the device. In examples, one or more processors 612 may include CPUs, graphic processing units (GPUs), holographic processors, other microprocessors, as well as microcontrollers, FPGAs, ASICs, DDICs, etc.

Depending on the configuration, the computer-readable media 614 may be an example of tangible non transitory computer storage media and may include volatile and non-volatile memory and/or removable and non-removable media implemented in any type of technology for storage of information such as computer readable instructions or modules, data structures, program modules or other data. Such computer readable media may include, but is not limited to, RAM, ROM, EEPROM, flash memory or other computer-readable media technology, CD-ROM, digital versatile disks (DVD) or other optical storage, magnetic cassettes, magnetic tape, solid state storage, magnetic disk storage, RAID storage systems, storage arrays, network attached storage, storage area networks, cloud storage, or any other medium that can be used to store information and which can be accessed by the processors 612. In examples, computer-readable media 614 may be housed on a system on chip printed circuit board, a functional printed circuit board, and/or one or more complementary elements 112.

In examples, one or more data modules 616 such as instruction, data stores, and so forth may be stored within the computer-readable media 614 and configured to execute on the processors 612. By way of example and not limitation, the data module(s) 616 may include software programs such as an operating system, one or more application programs such as internet browsing software, extended reality software, audio and/or video media player software, gaming software, camera capture software, image viewer and/or editor software, social networking software, productivity software (e.g., computer aided design, word processing software, database software, spreadsheet software, drawing software, animation software, video editing software, etc.), communications software (e.g., email, text/video/voice messaging, voice and/or video calling, conferencing, etc.), and/or any other software commonly used in connection with portable computing devices.

As noted above, in some examples, the stacked printed circuit board architecture described herein may be used in portable computing devices such as, but not limited to, head-mounted devices (e.g., a headset, glasses, visor, etc.) or other wearable device (e.g., gloves, suit, etc.). Such extended reality devices may include extended reality headsets that allow users to view, create, consume, and/or share media content. In some examples, extended reality headsets may include a display structure having a display which is placed over eyes of a user and allows the user to "see" or otherwise perceive the extended reality content or environment. As discussed further below, the term "extended reality" includes virtual reality, mixed reality, and/or augmented reality.

As used herein, the term "extended reality environment" refers to a simulated environment in which users can fully or partially immerse themselves. For example, an extended reality environment can comprise virtual reality, augmented reality, mixed reality, etc. An extended reality environment can include computer generated objects and elements with which a user can interact. In many cases, a user participates in an extended reality environment using a computing device, such as a dedicated extended reality device. As used herein, the term "extended reality device" refers to a computing device having extended reality capabilities and/or features. In particular, an extended reality device can refer to a computing device that can display an extended reality graphical user interface. An extended reality device can further display one or more visual elements within the extended reality graphical user interface and receive user input that targets those visual elements. In particular, an extended reality device can include any device capable of presenting a full or partial extended reality environment.

In some examples, an extended reality computing device includes a display structure that is placed over eyes of a user to display content to the user. The display structure may include one or more input devices (e.g., microphones, speakers, buttons, sensors, etc.) and one or more output devices (e.g., displays, projectors, speakers, etc.) that are contained within a housing of the extended reality computing device. The housing of the headset may also house one or more other components of the headset. For example, the headset may include the stacked printed circuit board architecture described here, which may include or be coupled to one or more other electrical components.

In examples, the computing device may be required to run intensive software and can benefit from the heat management and dissipation of the interposer 200 equipped with heat spreader 202 and/or stack-PCB architecture including one or more interposers 200 equipped with heat spreader 202 described herein. For example, some of the types of software (e.g., extended reality, gaming, video rendering, animation, computer aided design, etc.) running on a computing device can be computationally intensive and therefore generate considerable amounts of heat. In examples, the interposer 200 equipped with heat spreader 202 and/or stack-PCB architecture including one or more interposers 200 equipped with heat spreader 202 as described can distribute and dissipate the generated heat more effectively than conventional systems. This in turn may allow for more efficient functionality with decreased risk of overheating.

The computer-readable media 714 may also store data usable by the various instructions modules 716 and generated by the various components 702-708. The stored data 718 is not particularly limited and may include sensor data, program data, output data, transfer functions or the like.

The foregoing description has been presented for illustration; it is not intended to be exhaustive or to limit the scope of the disclosure to the precise forms disclosed. Persons skilled in the relevant art can appreciate that many modifications and variations are possible considering the above disclosure.

Some portions of this description describe the examples in terms of algorithms and symbolic representations of operations on information. These algorithmic descriptions and representations may be used by those skilled in the data processing arts to convey the substance of their work effectively to others skilled in the art. These operations, while described functionally, computationally, or logically, are understood to be implemented by computer programs or equivalent electrical circuits, microcode, or the like. The described operations and their associated components may be embodied in software, firmware, hardware, or any combinations thereof.

Any of the steps, operations, or processes described herein may be performed or implemented with one or more hardware or software modules, alone or in combination with other devices. In examples, a software module is implemented with a computer program product comprising a computer-readable medium containing computer program code, which can be executed by a computer processor for performing any or all the steps, operations, or processes described.

Examples may also relate to an apparatus for performing the operations herein. This apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Examples may also relate to a product that is produced by a computing process described herein. Such a product may comprise information resulting from a computing process, where the information is stored on a non-transitory, tangible computer readable storage medium and may include any embodiment of a computer program product or other data combination described herein.

Finally, the language used in the specification has been principally selected for readability and instructional purposes, and it may not have been selected to delineate or circumscribe the patent rights. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. An interposer comprising:
    a laminate structure defining an inner space; and
    a heat spreader comprising an active portion and a passive portion, the active portion being located in the inner space,
    wherein the active portion of the heat spreader has a thickness that is less than a depth of the inner space, and
    wherein the passive portion extends from the active portion to outside an outer boundary of the laminate structure in a first direction and to outside the outer boundary of the laminate structure in a second direction.

2. The interposer of claim 1, the laminate structure further comprising one or more connection points, each connection points comprising a through chip via.

3. The interposer of claim 2, further comprising a metal plating over at least each connection point.

4. The interposer of claim 1, wherein the active portion comprises a isothermal plate.

5. The interposer of claim 1, wherein the passive portion is thermally coupled to the active portion.

6. The interposer of claim 1, wherein the passive portion is an extension of the active portion.

7. A tri-layer structure comprising:
    a first printed circuit board;
    a second printed circuit board;
    an interposer positioned between the first printed circuit board and the second printed circuit board and coupled to the first printed circuit board and to the second printed circuit board; and
    a heat spreader located in the interposer, the heat spreader comprising an active portion and a passive portion, the active portion being nested within an inner space defined by the interposer,
    wherein the passive portion extends from the active portion to outside an outer boundary of the interposer in a first direction toward the first printed circuit board and to outside the outer boundary of the interposer in a second direction toward the second printed circuit board.

8. The tri-layer structure of claim 7, wherein at least one of the first printed circuit board and second circuit board comprises one or more electronic components thermally coupled to the heat spreader.

9. The tri-layer structure of claim 7, wherein the active portion comprises an isothermal plate.

10. The tri-layer structure of claim 7, wherein the interposer further comprises FR4 material.

11. A stack-PCB architecture comprising:
a core frame;
two or more printed circuit boards on a first side of the core frame, the two or more printed circuit boards interconnected by one or more first interposers; and
two or more complementary elements on second side of the core frame, the second side of the core frame being opposite the first side of the core frame, the two or more complementary elements interconnected by one or more second interposers,
wherein at least one of the first interposers or second interposers comprises a heat spreader comprising an active portion and a passive portion, the active portion being nested within an inner space defined by the interposer,
wherein the passive portion extends from the active portion to outside an outer boundary of the at least one of the first interposes or second interposes in a first direction and to outside the outer boundary of the at least one of the first interposes or second interposes in a second direction.

12. The stack-PCB architecture of claim 11, wherein the core frame further comprises a second heat spreader.

13. The stack-PCB architecture of claim 11, wherein the active portion comprises an isothermal plate.

14. The stack-PCB architecture of claim 11, wherein the heat spreader further comprises FR4 material.

15. The stack-PCB architecture of claim 14, wherein the passive portion is thermally coupled to the active portion and to a heat dissipating structure.

* * * * *